United States Patent
Stowe et al.

(10) Patent No.: US 8,477,403 B2
(45) Date of Patent: Jul. 2, 2013

(54) VARIABLE LENGTH IMAGING APPARATUS USING ELECTRONICALLY REGISTERED AND STITCHED SINGLE-PASS IMAGING SYSTEMS

(75) Inventors: Timothy David Stowe, Alameda, CA (US); Douglas N. Curry, San Mateo, CA (US); Patrick Y. Maeda, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/216,588

(22) Filed: Aug. 24, 2011

(65) Prior Publication Data

US 2013/0050803 A1 Feb. 28, 2013

(51) Int. Cl.
 *G02B 26/00* (2006.01)
(52) U.S. Cl.
 USPC .......................................... 359/292
(58) Field of Classification Search
 USPC ................. 359/290–292, 298, 316, 237, 239, 359/277, 201.1, 201.2, 223.1, 212.1, 212.2, 359/207.1, 619, 621; 353/122; 348/201, 203, 348/550, E3.009, E5.139; 345/84, 87; 349/57, 349/113
 See application file for complete search history.

(56) References Cited

U.S. PATENT DOCUMENTS

| | | | |
|---|---|---|---|
| 3,800,699 A | 4/1974 | Carley | |
| 5,105,369 A | 4/1992 | Nelson | |
| 5,500,670 A | 3/1996 | Ang et al. | |
| 5,719,682 A | 2/1998 | Venkateswar | |
| 5,721,622 A | 2/1998 | Venkateswar | |
| 5,754,217 A | 5/1998 | Allen | |
| 5,953,152 A | 9/1999 | Hewlett | |
| 5,954,424 A | 9/1999 | Anderson et al. | |
| 6,121,984 A * | 9/2000 | Anderson | 347/135 |
| 6,552,777 B2 | 4/2003 | Sunagawa | |
| 6,567,217 B1 | 5/2003 | Kowarz et al. | |
| 6,606,739 B2 | 8/2003 | Kanatake et al. | |
| 7,048,388 B2 | 5/2006 | Takaura et al. | |
| 7,218,380 B2 | 5/2007 | De Jager | |
| 7,508,570 B1 | 3/2009 | Meisburger | |
| 8,031,390 B2 | 10/2011 | Grasser et al. | |
| 8,104,901 B2 | 1/2012 | Kwon | |
| 8,199,178 B1 | 6/2012 | Payne | |
| 8,282,221 B2 * | 10/2012 | Arai et al. | 353/85 |
| 2008/0062390 A1 | 3/2008 | Zhang et al. | |
| 2010/0208329 A1 | 8/2010 | Sandstrom et al. | |

* cited by examiner

*Primary Examiner* — Tuyen Tra
(74) *Attorney, Agent, or Firm* — Bever, Hoffman & Harms, LLP; Patrick T. Bever

(57) ABSTRACT

An imaging apparatus including multiple spatial light modulators, each including light modulating elements arranged in two-dimensional array disposed in a homogenous light field, multiple anamorphic optical systems, each disposed downstream from an associated spatial light modulator, a scan structure, and an image stitching controller. The light modulating elements of each spatial light modulator are individually adjustable to either pass received homogenous light portions to the anamorphic optical systems, or to block/redirect the homogenous light portions, thereby generating a two-dimensional modulated light field. Each anamorphic optical system images and focuses received modulated light field onto an associated substantially one-dimensional scan line portion on the scan structure. The image stitching controller modifies the image data sent to each spatial light modulator such that selected light modulating elements are enabled or disabled, thereby electronically stitching the scan line portions to form a seamlessly stitched scan line image.

17 Claims, 19 Drawing Sheets

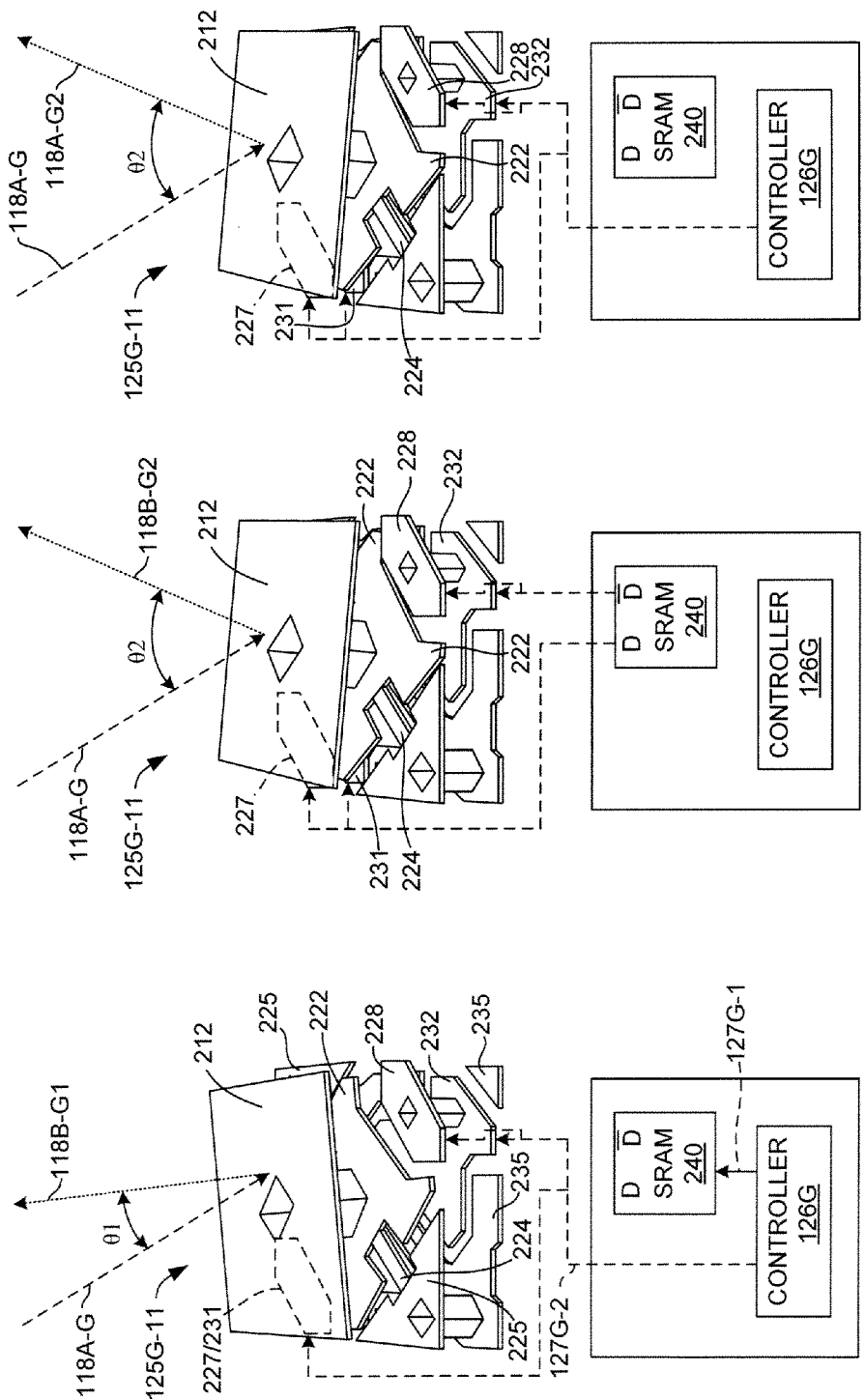

VARIABLE LENGTH IMAGING APPARATUS USING ELECTRONICALLY REGISTERED AND STITCHED SINGLE-PASS IMAGING SYSTEMS

FIELD OF THE INVENTION

This invention relates to imaging apparatus, and in particular to single-pass, high resolution imaging apparatus for high speed lithographic data image generation.

BACKGROUND OF THE INVENTION

Laser imaging systems are extensively used to generate images in applications such as mask and maskless lithographic patterning, laser texturing of surfaces, and laser cutting machines. Laser printers often use a raster optical scanner (ROS) that sweeps a laser perpendicular to a process direction by utilizing a polygon or galvo scanner, whereas for cutting applications lasers imaging systems use flatbed x-y vector scanning.

One of the limitations of the laser ROS approach is that there are design tradeoffs between image resolution and the lateral extent of the scan line. These tradeoffs arise from optical performance limitations at the extremes of the scan line such as image field curvature. In practice, it is extremely difficult to achieve 1200 dpi resolution across a 20" imaging swath with single galvanometers or polygon scanners. Furthermore, a single laser head motorized x-y flatbed architecture, ideal for large area coverage, is too slow for most high speed printing processes.

For this reason, monolithic light emitting diode (LED) arrays of up to 20" in width have an imaging advantage for large width xerography. Unfortunately, present LED array are only capable of offering 10 milliWatt power levels per pixel and are therefore only useful for some non-thermal imaging applications such as xerography. In addition, LED bars have differential aging and performance spread. If a single LED fails it requires the entire LED bar be replaced. Many other imaging or marking applications require much higher power. For example, laser texturing, or cutting applications can require power levels in the 10 W-100 W range. Thus LED bars cannot be used for these high power applications. Also, it is difficult to extend LEDs to higher speeds or resolutions above 1200 dpi without using two or more rows of staggered heads.

Higher power semiconductor laser arrays in the range of 100 mW-100 Watts do exist. Most often they exist in a 1D array format such as on a laser diode bar often about 1 cm in total width. Another type of high power directed light source are 2D surface emitting VCSEL arrays. However, neither of these high power laser technologies allow for the laser pitch between nearest neighbors to be compatible with 600 dpi or higher imaging resolution. In addition, neither of these technologies allow for the individual high speed control of each laser. Thus high power applications such as high power overhead projection imaging systems, often use a high power source such as a laser in combination with a spatial light modulator such as a DLP™ chip from Texas Instruments or liquid crystal arrays.

Prior art has shown that if imaging systems are arrayed side by side, they can be used to form projected images that overlap wherein the overlap can form a larger image using software to stitch together the image patterns into a seamless pattern. This has been shown in many maskless lithography systems such as those for PC board manufacturing as well as for display systems. In the past such arrayed imaging systems for high resolution applications have been arranged in such a way that they must use either two rows of imaging subsystems or use a double pass scanning configuration in order to stitch together a continuous high resolution image. This is because of physical hardware constraints on the dimensions of the optical subsystems. The double imaging row configuration can still be seamlessly stitched together using a conveyor to move the substrate in single direction but such a system requires a large amount of overhead hardware real estate and precision alignment between each imaging row.

For the maskless lithography application, the time between exposure and development of photoresist to be imaged is not critical and therefore the imaging of the photoresist along a single line does not need be exposed at once. However, sometimes the time between exposure and development is critical. For example, xerographic laser printing is based on imaging a photoreceptor by erasing charge which naturally decays over time. Thus the time between exposure and development is not time invariant. In such situations, it is desirable for the exposure system to expose a single line, or a few tightly spaced adjacent lines of high resolution of a surface at once.

In addition to xerographic printing applications, there are other marking systems where the time between exposure and development are critical. One example is the laser based variable data lithographic marking approach originally disclosed by Carley in U.S. Pat. No. 3,800,699 entitled, "FOUNTAIN SOLUTION IMAGE APPARATUS FOR ELECTRONIC LITHOGRAPHY". In standard offset lithographic printing, a static imaging plate is created that has hydrophobic imaging and hydrophilic non-imaging regions. A thin layer of water based dampening solution selectively wets the plate and forms an oleophobic layer which selectively rejects oil-based inks. In variable data lithographic marking disclosed in U.S. Pat. No. 3,800,699, a laser can be used to pattern ablate the fountain solution to form variable imaging regions on the fly. For such a system, a thin layer of dampening solution also decays in thickness over time, due to natural partial pressure evaporation into the surrounding air. Thus it is also advantageous to form a single continuous high power laser imaging line pattern formed in a single imaging pass step so that the liquid dampening film thickness is the same thickness everywhere at the image forming laser ablation step. However, for most arrayed high power high resolution imaging systems, the hardware and packaging surrounding a spatial light modulator usually prevent a seamless continuous line pattern to be imaged. Furthermore, for many areas of laser imaging such as texturing, lithography, computer to plate making, large area die cutting, or thermal based printing or other novel printing applications, what is needed is laser based imaging approach with high total optical power well above the level of 1 Watt that is scalable across large process widths in excess of 20" as well as having achievable resolution greater than 1200 dpi and allows high resolution high speed imaging in a single pass.

SUMMARY OF THE INVENTION

The present invention is directed to an imaging (e.g., lithographic) apparatus including two or more spatial light modulators and associated anamorphic optical systems that modulate homogenous light and form anamorphically imaged in the process and cross-process directions, and concentrated (converged or linearly-focused) light fields in a substantially one-dimensional imaging region on a targeted scan structure (e.g., a drum roller). Each spatial light modulator (e.g., digital micromirror (DMD) devices, electro-optic diffractive modulator arrays, or arrays of thermo-optic absorber elements) includes individually addressable elements having light modulating structures that modulate (e.g., either passes or impedes/redirects) associated portions of the homogenous light according to predetermined image data. Each anamorphic optical system images and concentrates the modulated homogenous light received from an associated spatial light modulator to form an associated scan line portion, and the scan line portions formed by each anamorphic optical system collectively form the elongated scan line in the imaging region of the scan structure. Here the term anamorphic optical system refers to any system of optical lens, mirrors, or other elements that project the light from an object plane such as a pattern of light formed by a spatial light modulator, to a final imaging plane with a differing amount of magnification along orthogonal directions. Thus, for example, a square-shaped imaging pattern formed by a 2D spatial light modulator could be anamorphically projected so as to magnify its width and at same time demagnify (or bring to a concentrated focus) its height thereby transforming square shape into an image of an extremely thin elongated rectangular shape at the final image plane. By utilizing the anamorphic optical system to concentrate the modulated homogenous light, high total optical intensity (flux density) (i.e., on the order of hundreds of Watts/$cm^2$) can be generated on any point of the scan line image without requiring a high intensity light source pass through a spatial light modulator, thereby facilitating a reliable yet high power imaging system that can be used, for example, for single-pass high resolution high speed printing applications. Furthermore, it should be clarified that the homogenous light generator, may include multiple optical elements such as light pipes or lens arrays, that reshape the light from one or more non-uniform sources of light so as to provide substantially uniform light intensity across at least one dimension of a two-dimensional light field. Many existing technologies for generating laser "flat top" profiles with a high degree of homogenization exist in the field.

According to an aspect of the present invention, each spatial light modulator includes multiple light modulating elements that are arranged in a two-dimensional array, and a controller (e.g., an SRAM array) that individually controls the modulating elements such that the light modulating structure of each modulating element is adjustable between an "on" (first) modulated state and an "off" (second) modulated state according to received image data. When one of the modulating elements is in the "on" modulated state, its light modulating structure directs the received light portion in a corresponding predetermined direction (i.e., the element passes the associated light portion toward the anamorphic optical system). Conversely, when the modulating element is in the "off" modulated state, the associated received light portion is prevented from passing along the corresponding predetermined direction by the modulating element to the anamorphic optical system. By modulating homogenous light in this manner prior to being anamorphically imaged and concentrated, the present invention is able to produce a high power scan line along the entire imaging region simultaneously, as compared with a rastering system that only applies high power to one point of the scan line at any given instant. In addition, because the relatively low power homogenous light is spread over the large number of modulating elements, the present invention can be produced using low-cost, commercially available spatial light modulating devices, such as digital micromirror (DMD) devices, electro-optic diffractive modulator arrays, or arrays of thermo-optic absorber elements.

According to an embodiment of the present invention, each spatial light modulator includes light modulating elements that are arranged in an array of rows and columns, and the associated anamorphic optical system is arranged to converge light portions received from each column into an associated imaging region ("pixel") of the resulting scan line portion. That is, the light portions from all of the light modulating elements in a given column are imaged and concentrated by the anamorphic optical system onto the same corresponding imaging region of the scan line portion so that the resulting imaging "pixel" produced on the imaging region is the composite light from all light modulating elements in the given column that are in the "on" state. A key aspect of the present invention lies in understanding that the light portions passed by each light modulating element represent one bit of binary image data that are delivered to the imaging region of the scan structure by an associated anamorphic optical systems, so that the brightness of each imaging region "pixel" is controlled by the number of elements in the associated column that are in the "on" state. Accordingly, by individually controlling the multiple modulating elements disposed in each column, and by converging the light passed by each column onto a corresponding imaging region, the present invention provides an imaging system having gray-scale capabilities using constant (non-modulated) homogenous light. In addition, if the position of a group of "on" pixels in each column is adjusted up or down the column, this arrangement facilitates software electronic compensation of bow (i.e. "smile" of a straight line) and skew.

According to an aspect of the invention, the apparatus further includes an image stitching controller that serves to electronically stitch the anamorphically imaged and concentrated light fields such that the scan line image is seamlessly produced in the imaging region of the targeted scan structure. In one embodiment, the electronic stitching involves separating the "raw" image data representing an entire scan line into groups of modified image data that are respectively transmitted to each spatial light modulators such that the resulting scan line portions form a seamless scan line image in the imaging region of the scan structure. In one embodiment, the associated spatial light modulators and anamorphic optical systems are purposefully arranged such that the anamorphically imaged and concentrated light fields produced by adjacent anamorphic optical systems are overlapped in the imaging region of the scan structure. That is, adjacent spatial light modulators and anamorphic optical systems are arranged such that the outmost edges of the anamorphically imaged and concentrated light fields generate scan line portions in the same overlap region of the imaging region. This overlap ensures that the imaging apparatus is able to produce the scan line without gaps that can be caused when the adjacent spatial light modulators are placed too far apart during assembly, and is electronically corrected (i.e., the potential overlap is eliminated) by modifying the image data such that selected columns of light modulating elements of one or more of the spatial light modulators are effectively "disabled" (i.e., image data is not sent the this column, and its elements remain in the "off" modulated state). By selectively disabling overlapping columns of light modulating elements, the resulting concentrated scan line portions are stitched together to form a seamless elongated scan line image. Similarly, vertical (cross-scan) offsets between adjacent spatial light modulators, which can also occur during assembly, are corrected by modifying image data transmitted to one of the light modulating elements is shifted to a different row of modulating elements such that a feature extending parallel to the scan line image is aligned in a cross-scan direction (e.g., vertical) within the elongated imaging region. By utilizing the modulation controller to selectively deactivate modulating elements of adjacent spatial light modulators that project image "pixels" into each overlap region, the present invention provides an imaging apparatus in which image alignment imperfections are corrected utilizing relatively straight-forward "software" control techniques, thereby easing manufacturing tolerances and facilitating the production of low-cost, high resolution lithographic apparatus that are scalable to any scan line length.

According to an embodiment of the present invention, the homogenous light generator includes one or more light sources and a light homogenizer optical system for homogenizing light beams generated by the light sources. High power laser light homogenizers are commercially available from several companies including Lissotschenko Mikrooptik also known as LIMO GmbH located in Dortmund, Germany. One benefit of converting a point source high intensity light beams (i.e., light beams having a first, relatively high flux density) to relatively low intensity homogenous light source (i.e., light having a second flux density that is lower than the flux density of the high energy beam) in this manner is that this arrangement facilitates the use of a high energy light source (e.g., a laser or light emitting diode) without requiring the construction of spatial light modulator using special optical glasses and antireflective coatings that can handle the high energy light. That is, by utilizing a homogenizer to spread the high energy laser light out over an extended two-dimensional area, the intensity (Watts/cc) of the light over a given area (e.g., over the area of each modulating element) is reduced to an acceptable level such that low cost optical glasses and antireflective coatings can be utilized to form spatial light modulator with improved power handling capabilities. Spreading the light uniformly out also eliminates the negatives imaging effects that point defects (e.g., microscopic dust particles or scratches) have on total light transmission losses.

According to another embodiment of the present invention, the overall anamorphic optical system includes a cross-process optical subsystem and a process-direction optical subsystem that concentrate the modulated light portions received from the spatial light modulator such that the concentrated modulated light forms the substantially one-dimensional scan line image, wherein the concentrated modulated light at the scan line image has a higher optical intensity (i.e., a higher flux density) than that of the homogenized light. By anamorphically concentrating (focusing) the two-dimensional modulated light pattern to form a high energy elongated scan line, the imaging system of the present invention outputs a higher intensity scan line. The scan line is usually directed towards and swept over a moving imagine surface near its focus. This allows an imaging system to be formed such as a printer. The direction of the surface sweep is usually perpendicular to the direction of the scan line and is customarily called the process direction. In addition, the direction parallel to the scan line is customarily called the cross-process direction. The scan line image formed may have different pairs of cylindrical or acylindrical lens that address the converging and tight focusing of the scan line image along the process direction and the projection and magnification of the scan line image along the cross-process direction. In one specific embodiment, the cross-process optical subsystem includes first and second cylindrical or acylindrical lenses arranged to project and magnify the modulated light onto the elongated scan line in a cross-process direction, and the process-direction optical subsystem includes a third cylindrical or acylindrical focusing lens arranged to concentrate and demagnify the modulated light on the scan line in a direction parallel to a process direction. This arrangement facilitates generating a wide scan line that can be combined ("stitched" or blended together with a region of overlap) with adjacent optical systems to produce an assembly having a substantially unlimited length scan line. An optional collimating field lens may also be disposed between the spatial light modulator and cylindrical or acylindrical focusing lens in both the process and cross-process direction. It should be understood that the overall optical system may have several more elements to help compensate for optical aberrations or distortions and that such optical elements may be transmissive lenses or reflective mirror lenses with multiple folding of the beam path.

According to a specific embodiment of the present invention, the spatial light modulator comprises a DLP™ chip from Texas Instruments, referred to as a Digital Light Processor in the packaged form. The semiconductor chip itself is often referred to as a Digital Micromirror Device or DMD. This DMD includes an two dimensional array of microelectromechanical (MEMs) mirror mechanisms disposed on a substrate, where each MEMs mirror mechanism includes a mirror that is movably supported between first and second tilted positions according to associated control signals generated by a controller. The spatial light modulator and the anamorphic optical system are positioned in a folded arrangement such that, when each mirror is in the first tilted position, the mirror reflects its associated received light portion toward the anamorphic optical system, and when the mirror is in the second tilted position, the mirror reflects the associated received light portion away from the anamorphic optical system towards a beam dump. An optional heat sink is fixedly positioned relative to the spatial light modulator to receive light portions from mirrors disposed in the second tilted position towards the beam dump. An optional frame is utilized to maintain each of the components in fixed relative position. An advantage of a reflective DMD-based imaging system is that the folded optical path arrangement facilitates a compact system footprint.

According to yet another embodiment of the present invention, the spatial light modulators are tilted relative to their respective anamorphic optical systems such that the rows of modulating elements are aligned at an acute tilt angle relative to the scan line image, whereby each anamorphic optical system focuses each modulated light portion onto an associated sub-imaging region of elongated scan line image. The benefit of this tilted orientation is that the apparatus produces a higher resolution linear image than that possible using a right-angle orientation, and allows for sub-pixel spacing addressability, and provides an opportunity to utilize software to further align image "pixels" spanning adjacent scan image portions with fractional precision in both the X-axis and Y-axis directions. The spatial light modulators are optionally set at a tilt angle that produces an alignment of each imaging region with multiple elements disposed in different columns of the array, thereby facilitating variable resolution and variable intensity. This arrangement also facilitates software adjustment for manufacturing defects such as bow, tilt and process direction velocity imperfections such as banding.

According to another specific embodiment of the present invention, an assembly includes multiple imaging systems, where each imaging systems includes means for generating homogenous light such that the homogenous light forms a substantially uniform two-dimensional homogenous light field, means for modulating portions of the homogenous light in accordance with the predetermined scan line image data such that the modulated light portions form a two-dimensional modulated light field, and means for anamorphically concentrating the modulated light portions along the process direction and anamorphically projecting with magnification the light field along the cross-process direction such that the concentrated modulated light portions form an elongated scan line image. Under this arrangement, multiple imaging systems can be situated side by side to form a substantially collinear "macro" single long scan line image scalable to lengths well over twenty inches. This arrangement allows for the entire system to sweep a variable optical pattern over an imaging substrate in a single pass without any staggering or time delays during the sweep between each imaging system subunit. In a specific embodiment, the spatial light modulator of each system is a DMD device, and the anamorphic optical system is positioned in the folded arrangement described above. Another advantage of the DMD-based imaging system is that the folded arrangement facilitates combining multiple imaging systems to produce a scan line in excess of 20" using presently available DMD devices. It should also be understood that each scan-line that is stitched together need not be directed exactly normal to the same focal plane imaging surface, i.e. the optical paths need not be collinear between adjacent subsystems. In fact in order to facilitate more room for the body of each individual optical system, it is possible for the scan line to be received from each adjacent subsystem at small interlaced angles.

According to another embodiment of the present invention, a scanning/printing apparatus that includes the single-pass imaging system described above, and a scan structure (e.g., an imaging drum cylinder) that is disposed to receive the concentrated modulated light from the anamorphic optical system. According to a specific embodiment, the imaging surface may be one that holds a damping (fountain) solution such as is used for variable data lithographic printing.

BRIEF DESCRIPTION OF THE DRAWINGS

These and other features, aspects and advantages of the present invention will become better understood with regard to the following description, appended claims, and accompanying drawings, where:

FIGS. 9(A), 9(B) and 9(C) are perspective views showing the light modulating element of FIG. 8 during operation;

DETAILED DESCRIPTION OF THE DRAWINGS

The present invention relates to improvements in imaging systems and related apparatus (e.g., scanners and printers). The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
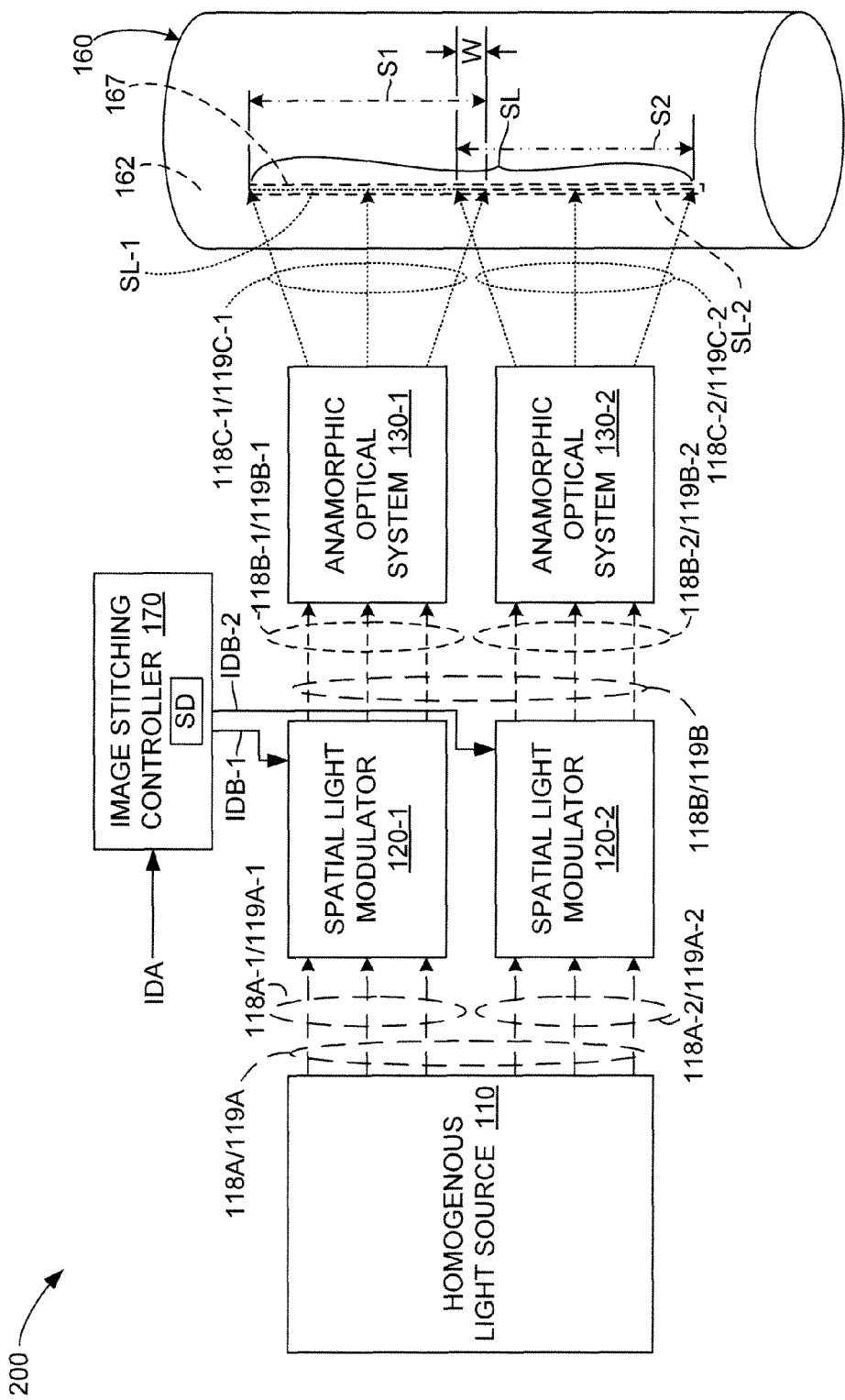
FIG. 1 is a modified block diagram depicting a generalized imaging apparatus including two or more spatial light modulators according to an exemplary embodiment of the present invention.
Figure 2:
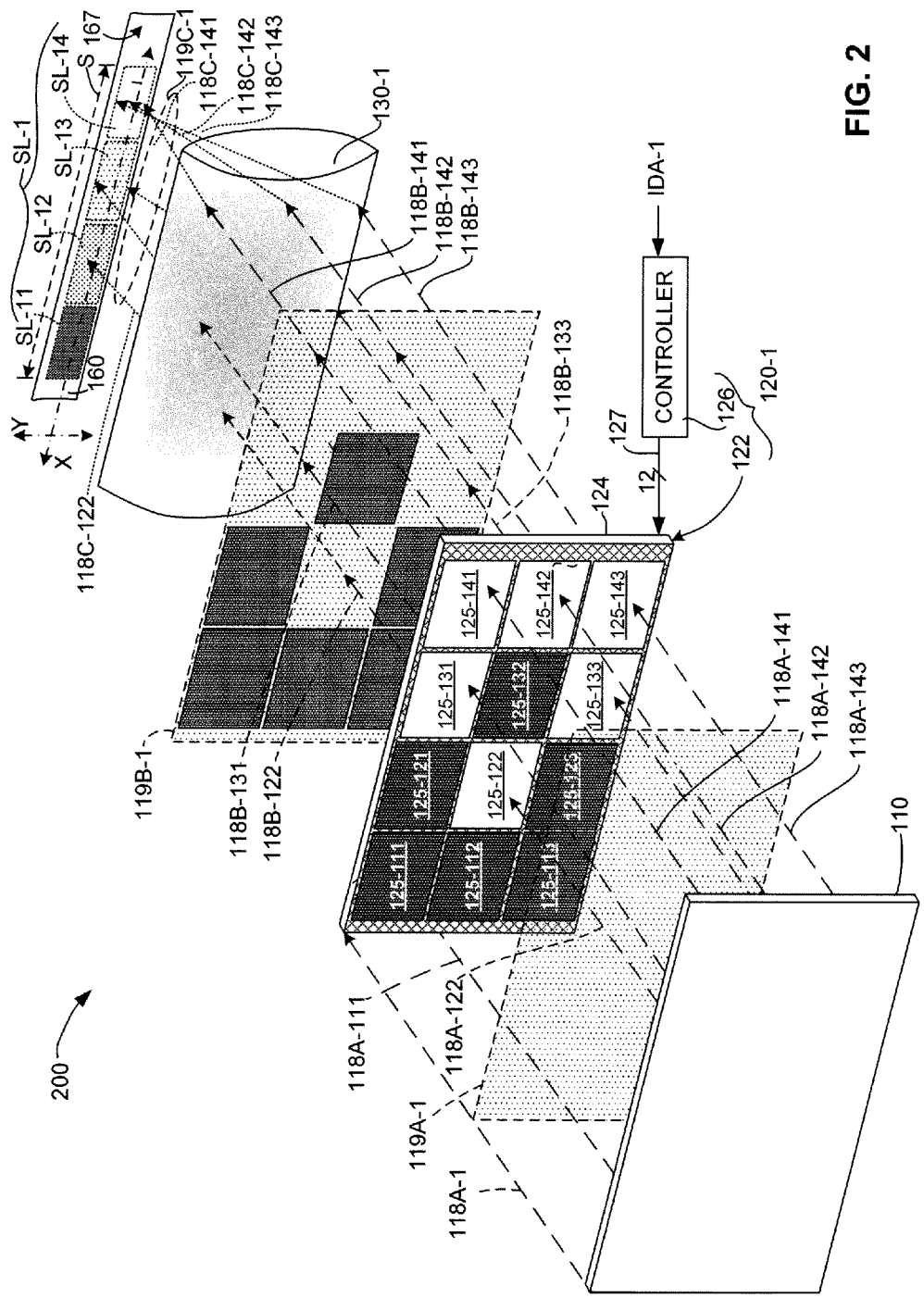
FIG. 2 is a top side perspective view showing a portion of the apparatus of FIG. 1 according to an embodiment of the present invention.

FIG. 1 is a perspective view showing a single-pass imaging apparatus 200 according to a simplified exemplary embodiment of the present invention, and FIG. 2 is a perspective view showing a portion of a single-pass imaging apparatus 200 in additional detail.

Referring to FIG. 1, imaging apparatus 200 generally includes a homogenous light generator 110, at least two spatial light modulators 120-1 and 120-2, at least two anamorphic optical (e.g., projection lens) system 130-1 and 130-2, scan structure 160 upon which a scan line image SL is generated in response to "raw" image data IDA, and an image stitching controller 170 that serves to modify the received image data IDA in accordance with predetermined stitching data SD, and to produce modified image data groups IDB-1 and IDB-2 that are respectively transmitted to spatial light modulators 120-1 and 120-2, whereby spatial light modulators 120-1 and 120-2 are cooperatively controlled as set forth below such that a seamless scan line image SL is generated in an elongated imaging region 167 of scan structure 160. Although the present invention is described below with reference to two or three associated pairs of spatial light modulators and anamorphic optical systems, imaging apparatus produced in accordance with the present invention may include any number of such pairs utilizing the characteristics described below. In addition, anamorphic optical systems 130-1 and 130-2 are represented for the purposes of simplification in FIG. 1 by single generalized anamorphic projection lens. In practice anamorphic systems 130-1 and 130-2 are typically each composed of multiple separate cylindrical or acylindrical lenses, such as described below with reference to FIGS. 6(A), 6(B) and 19.

Referring to the left side of FIG. 1 and to the lower left portion of FIG. 2, homogenous light generator 110 serves to generate continuous (i.e., constant/non-modulated) homogenous light 118A that forms a substantially uniform two-dimensional homogenous light field 119A. That is, homogenous light generator 110 is formed such that all portions of homogenous light field 119A, which is depicted by the projected dotted rectangular box (i.e., homogenous light field 119A does not form a structure), receive light energy having substantially the same constant energy level (i.e., substantially the same flux density). For descriptive purposes, light that directed from homogenous light generator 110 to spatial light modulator 120-1 is referred to homogenous light portion 118A-1, and light that directed from homogenous light generator 110 to spatial light modulator 120-2 is referred to homogenous light portion 118A-2. As set forth in additional detail below, homogenous light generator 110 is implemented using any of several technologies, and is therefore depicted in a generalized form in FIGS. 1 and 2.

Referring to the center left portions of FIG. 1, spatial light modulators 120-1 and 120-2 are disposed in homogenous light field 119A, and serve the purpose of modulating portions of homogenous light 118A accordance with modified image data groups IDB-1 and IDB-2. As indicated in FIG. 1, spatial light modulator 120-1 receives homogenous light portion 118A-1 from homogeneous light generator 110, and selectively passes modulated light portion 118B-1 to anamorphic optical system 130-1. Similarly, spatial light modulator 120-2 receives homogenous light portion 118A-2 from homogeneous light generator 110, and selectively passes modulated light portion 118B-2 to anamorphic optical system 130-2.

FIG. 2 shows a portion of apparatus 200 including exemplary spatial light modulator 120-1 and a simplified associated anamorphic optical system 130-1, along with an associated portion of homogeneous light generator 110 and elongated imaging region 167 of scan structure 160. It is understood that spatial light modulator 120-2 and anamorphic optical system 130-2 are constructed and operate in a manner identical to that described with reference to FIG. 2. In a practical embodiment a suitable spatial light modulator can be purchased commercially and would typically have two-dimensional (2D) array sizes of 1024×768 (SVGA resolution) or higher resolution with light modulation element (pixel) spacing on the order of 5-20 microns. For purposes of illustration, only a small subset of light modulation elements is depicted in the figures discussed herein.

Referring to the lower left-center portion of FIG. 2, spatial light modulator 120-1 generally includes a modulating element array 122 made up of modulating elements 125-111 to 125-143 disposed on a support structure 124, and a device control circuit (controller) 126 for transmitting image control signals 127 to modulating elements 125-11 to 125-43 in response to modified image data IDB-1. Modulating elements 125-111 to 125-143 are arranged in a two-dimensional array 122 and disposed such that a light modulating structure (e.g., a mirror, a diffractive element, or a thermo-optic absorber element) of each modulating element 125-111 to 125-143 receives a corresponding portion of homogenous light 118A (e.g., modulating elements 125-111 and 125-122 respectively receive homogenous light portions 118A-111 and 118A-122), and is positioned to selectively pass (modulate) the received corresponding modulated light portion along a predetermined direction toward anamorphic optic 130-1 (e.g., modulating element 125-122 passes modulated light portion 118B-122 to anamorphic optical system 130-1, but 125-111 blocks light from reaching anamorphic optical system 130-1). In particular, each light modulating element 125-111 to 125-143 is individually controllable by controller 126 in response to associated control signals 127 to switch between an "on" (first) modulated state and an "off" (second) modulated state. When a given modulating element is in the "on" modulated state, the modulating element is actuated to direct the given modulating element's associated received light portion toward anamorphic optic system 130-1. For example, in the simplified example, modulating element 125-143 is unshaded (white) to indicate it is rendered transparent in response to the associated control signal such that light portion 118A-143 passes through modulating element 125-143 toward anamorphic optic 130-1, whereby in the exemplary embodiment the passed light portion becomes "modulated" light portion 118B-143 that passes from modulating element 125-143 to a corresponding portion of anamorphic optic system 130-1. Conversely, when a given modulating element is in the "off" modulated state, the modulating element is actuated to prevent (e.g., block or redirect) the given modulating element's associated received light portion. For example, modulating element 125-111 is darkened to indicate it is opaque, thereby preventing received light portion 118A-111 from being passed to anamorphic optical system 130-1. By selectively turning "on" or "off" modulating elements 125-111 to 125-143 in accordance with modified image data IDB-1 supplied to controller 126 from image stitching controller 170 (see FIG. 1), spatial light modulator 120-1 serves to modulate (i.e., pass or not pass) portions of continuous homogenous light 118A-1 such that a two-dimensional modulated light field 119B-1 is generated that is passed to anamorphic optical system 130-1. As set forth in additional detail below, spatial light modulator 120-1 is implemented using any of several technologies, and is therefore not limited to the generalized "pass through" arrangement depicted in FIG. 2.

Referring to the center right portion of FIG. 2, anamorphic optical system 130-1 serves to anamorphically image and concentrate (focus) the modulated light portions, which are received from spatial light modulator 120-1 by way of two-dimensional light field 119B-1, onto an associated portion of imaging region 167 such that elongated scan line portion SL-1 is generated having a width Si (i.e., measured in the X-axis direction indicated in FIG. 2). In particular, anamorphic optical system 130-1 includes one or more optical elements (e.g., lenses or mirrors) that are positioned to receive the two-dimensional pattern of light field 119B-1 that are directed to anamorphic optical system 130-1 from spatial light modulator 120-1 (e.g., modulated light portion 118B-143 that is passed from modulating element 125-143), where the one or more optical elements (e.g., lenses or mirrors) are arranged to image and concentrate the received light portions to a greater degree along the cross-scan (e.g., Y-axis) direction than along the scan (X-axis) direction, whereby the received light portions are anamorphically focused to form an elongated scan line image portion SL-1 that extends parallel to the scan (X-axis) direction. As set forth in additional detail below, anamorphic optical systems 130-1 and 130-2 are implemented using any of several optical arrangements, and is therefore not limited to the generalized lens depicted in FIGS. 1 and 2.

According to an aspect of the present invention, light modulating elements 125-111 to 125-143 of spatial light modulator 120-1 are disposed in a two-dimensional array 122 of rows and columns, and anamorphic optical system 130-1 is arranged to concentrate light portions passed through each column of modulating elements on to each imaging region SL-11 to SL-14 of scan line image portion SL-1. As used herein, each "column" includes light modulating elements arranged in a direction that is substantially perpendicular to scan line image portion SL-1 (e.g., light modulating elements 125-111, 125-112 and 125-113 are disposed in the rightmost column of array 122), and each "row" includes light modulating elements arranged in a direction substantially parallel to scan line image portion SL-1 (e.g., light modulating elements 125-111, 125-121, 125-131 and 125-141 are disposed in the uppermost row of array 122). In the simplified arrangement shown in FIG. 2, any light passed through elements 125-111, 125-112 and 125-113 is imaged and concentrated by anamorphic optical system 130-1 onto imaging region SL-11, any light passed through elements 125-121, 125-122 and 125-123 is concentrated onto imaging region SL-12, any light passed through elements 125-131, 125-132 and 125-133 is concentrated onto imaging region SL-13, and any light passed through elements 125-141, 125-142 and 125-143 is concentrated onto imaging region SL-14.

According to another aspect of the present invention, gray-scale imaging is achieved by controlling the on/off states of selected modulating elements in each column of array 122. That is, the brightness (or darkness) of the "spot" formed on each imaging region SL-11 to SL-14 is controlled by the number of light modulating elements that are turned "on" in each associated column. For example, referring to the imaging regions located in the upper right portion of FIG. 2, all of light modulating elements 125-111, 125-112 and 125-113 disposed in the leftmost column of array 122 are turned "off", whereby image region SL-11 includes a "black" spot, as depicted in the upper right portion of FIG. 2. In contrast, all of light modulating elements 125-141, 125-142 and 125-143 disposed in the rightmost column of array 122 are turned "on", whereby light portions 118B-141, 118B-142 and 118B-143 pass from spatial light modulator 120-1 and are concentrated by anamorphic optical system 130-1 such that imaging region SL-14 includes a maximum brightness ("white") spot. The two central columns are controlled to illustrate gray scale imaging, with modulating elements 125-121 and 125-123 turned "off" and modulating element 125-122 turned "on" to pass a single light portion 118B-123 that forms a "dark gray" spot on imaging region SL-12, and modulating elements 125-131 and 125-133 turned "on" with modulating element 125-132 turned "off" to pass two modulated light portions 118B-131 and 118B-133 that form a "light gray" spot on imaging region SL-13. One key to this invention lies in understanding the light portions passed by each light modulating element represent one pixel of binary data that is delivered to the scan line by anamorphic optical system 130-1, so that brightness of each imaging pixel of the scan line is determined by the number of light portions (binary data bits) that are directed onto the corresponding imaging region. Modulated light portions directed from each row (e.g., elements 125-111 to 125-141) are summed with light portions directed from the other rows such that the summed light portions are wholly or partially overlapped to produce a series of composite energy profiles at imaging regions (scan line image segments) SL-11 to SL-14. Accordingly, by individually controlling the multiple modulating elements disposed in each column of array 122, and by concentrating the light passed by each column onto a single image region, the present invention provides an imaging system having gray-scale capabilities that utilizes the constant (non-modulated) homogenous light 118A-1 generated by homogenous light generator 110.

Note that the simplified spatial light modulator 120-1 shown in FIGS. 1 and 2 includes only three modulating elements in each column for descriptive purposes, and those skilled in the art will recognize that increasing the number of modulating elements disposed in each column of array 122 would enhance gray scale control by facilitating the production of spots exhibiting additional shades of gray. In one preferred embodiment at least 24 pixels are used in one column to adjust grayscale, thus allowing for single power adjustments in scan line segments of at close to 4%. A large number of modulating elements in each column of array 122 also facilitates the simultaneous generation of two or more scan lines within a narrow swath, and also allows for scrolling of image data to prevent blurring as set forth in additional detail below. Yet another benefit to providing a large number of light modulating elements in each column is that this arrangement would allows for one or more "reserve" or "redundant" elements that are only activated when one or more of the regularly used elements malfunctions, thereby extending the operating life of the imaging system or allowing for corrections to optical line distortions such as bow (also known as line smile).

Referring again to FIG. 1, image stitching controller 170 modifies "raw" image data IDA in accordance with predetermined stitching data SD such that, when modified image data group IDB-1 is transmitted to spatial light modulator 120-1 and modified image data group IDB-2 is transmitted to spatial light modulator 120-2, their respective light modulating elements are cooperatively controlled such that the scan line portions SL-1 and SL-2 seamlessly form scan line image SL in elongated imaging region 167. Image data IDA consists of a series of electronic bits transmitted to modulation controller 170 in order to generate scan line image SL, which is a one-dimensional line (or a few lines) of a two-dimensional image or pattern. Similar to the type of image data that is provided to a typical ROS-type image scanner or printer, image data IDA includes groups of electronic bits (or bytes) that correspond to desired image pixels, where each image pixel is a dark, bright, gray, colored or otherwise characterized "spot" of a corresponding two-dimensional image or pattern. Image stitching controller 170 utilizes stitching data SD to separates and modifies "raw" image data IDA into two image data groups IDB-1 and IDB-2 such that, when modified image data groups IDB-1 and IDB-2 are transmitted to spatial light modulators 120-1 and 120-2, they modulate homogenous light 118A such that scan line portions SL-1 and SL-2 collectively form scan line image SL without gaps or overlaps. Note that image data IDA is supplied from an external source (e.g., a personal computer, not shown) according to a predetermined format. Those skilled in the art understand that various formats may be utilized, and that the appended claims are not limited to any particular format.

Referring again to FIG. 1, according to an aspect of the present invention, at least one of spatial light modulators 120-1 and 120-2 and corresponding anamorphic optical systems 130-1 and 130-2 are purposefully arranged to produce an overlapping pattern in imaging region 167 of scan structure 160. That is, the components are arranged such that, if all of the modulating elements in spatial light modulators 120-1 and 120-2 were turned "on", the resulting scan line portions SL-1 and SL-2 would overlap in region W. In particular, with all modulating elements of adjacent spatial light modulators 120-1 and 120-2 turned "on", the lowermost edge of anamorphically imaged and concentrated light field 119C-1 overlaps the uppermost end of anamorphically imaged and concentrated light field 119C-2, whereby sections of scan line portions SL-1 and SL-2 are simultaneously generated in overlap region W of imaging region 167. This overlapping component arrangement ensures that imaging apparatus 200 is able to produce the scan line SL without gaps that can be caused when the adjacent anamorphic optical systems 130-1 and 130-2 are placed too far apart during assembly.

According to another aspect of the present invention, image stitching controller 170 serves to electronically correct the above-mentioned intentional overlap condition (and to make additional corrections, if necessary) utilizing predetermined stitching data SD, which is generated after assembly of apparatus 200 by determining the extend of any overlap/misalignment, and modifying the associated image data using the methods described below to correct the overlap/misalignment.

Figure 3A:
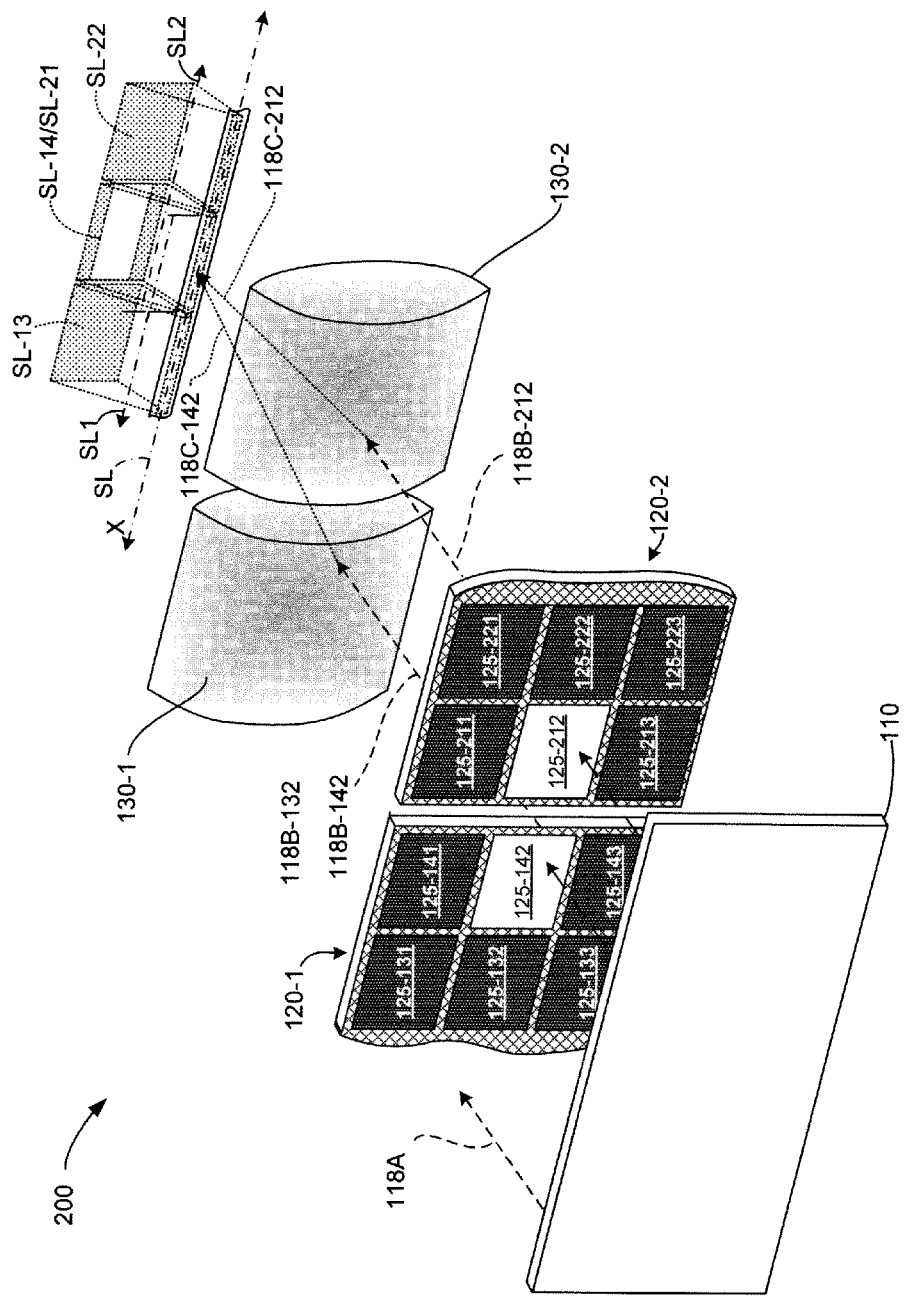
FIGS. 3(A) and 3(B) are partial perspective views showing a method for modifying image data to adjust for image overlap in the apparatus of FIG. 1 according to an embodiment of the present invention.
Figure 3B:
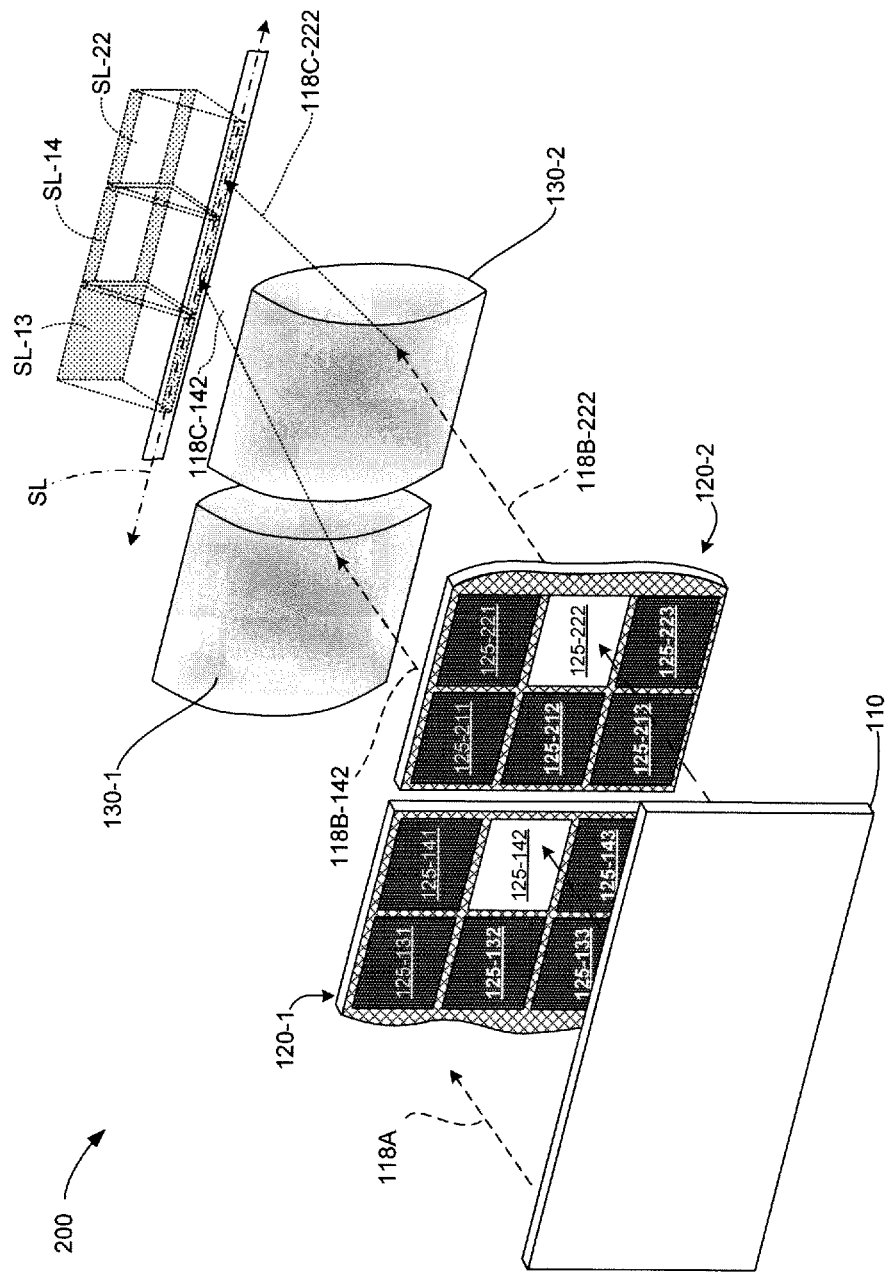

According to an embodiment of the present invention, in order to correct the intentional horizontal (scan-wise) overlap condition described above, modified image data groups IBD-1 and IBD-2 are generated such that one or more columns of modulating elements of one or more of spatial light modulators 120-1 and 120-2 are effectively "disabled" (i.e., image data is not sent the these columns, and its modulating elements remain in the "off" modulated state) such that adjacent end portions of scan line portions SL-1 and SL-2 are aligned in the scan direction to produce a seamlessly stitched portion of scan line image SL. This modification is illustrated with reference to the simplified example shown in FIG. 3(A) and FIG. 3(B), which shows a portion of apparatus 200 including portions of spatial light modulators 120-1 and 120-2 and associated anamorphic optical systems 130-1 and 130-2. FIG. 3(A) illustrates an attempt to generate a scan line image having two horizontally arranged white "pixels", and involves transmitting image data to spatial light modulators 120-1 and 120-2 such that adjacent elements on the two modulators (i.e., element 125-142 of spatial light modulator 120-1 and element 125-212 of spatial light modulator 120-2) are in the "on" modulated state. As described above, this modulation pattern produces modulated light portion 118B-142 of homogenous light 118A to pass onto anamorphic optical system 130-1, and for modulated light portion 118B-212 to pass onto anamorphic optical system 130-2. In this example, due to the intentional overlapping arrangement, concentrated light portions 118B-132 and 118B-142 are respectively directed onto the same portion of imaging region 167 (which is shown in an enlarged fashion in FIG. 3(A) for illustrative purposes), thereby producing a single white "dot" formed by scan line portion SL-14 of scan line image SL-1 and scan line portion SL-21 of scan line image SL-2. As illustrated in FIG. 3(B), this overlap is addressed by electronically disabling the first rightmost column of spatial light modulator 120-2, and modifying the image data such that all image control data is shifted to one column to the left (i.e., such that the associated image data causes element 125-222 to turn "on" instead of element 125-212). Due to the additional spacing between modulated light portions 118B-142 and 118B-222, which are respectively passed by element 125-142 of spatial light modulator 120-1 and element 125-222 of spatial light modulator 120-2 and imaged and concentrated by anamorphic optical systems 130-1 and 130-2 in the manner described above, two horizontally arranged white "dots" are formed by scan line portion SL-14 of scan line image SL-1 and scan line portion SL-22 of scan line image SL-2. By selectively disabling the overlapping columns of light modulating elements, the resulting concentrated scan line portions SL-1 and SL-2 are stitched together to form a seamless elongated scan line image SL. In addition, once the necessary offset is determined, stitching data SD used by image stitching controller 170 is updated to indicate that all image data transmitted to spatial light modulator 120-2 is shifted one column to the left, thereby effectively eliminating the overlapping pattern for all subsequent print/scan operations. Of course, the same stitching result could have been achieved by modifying stitching data SD to shift image data sent to spatial light modulator 120-1 to the right.

Figure 4A:
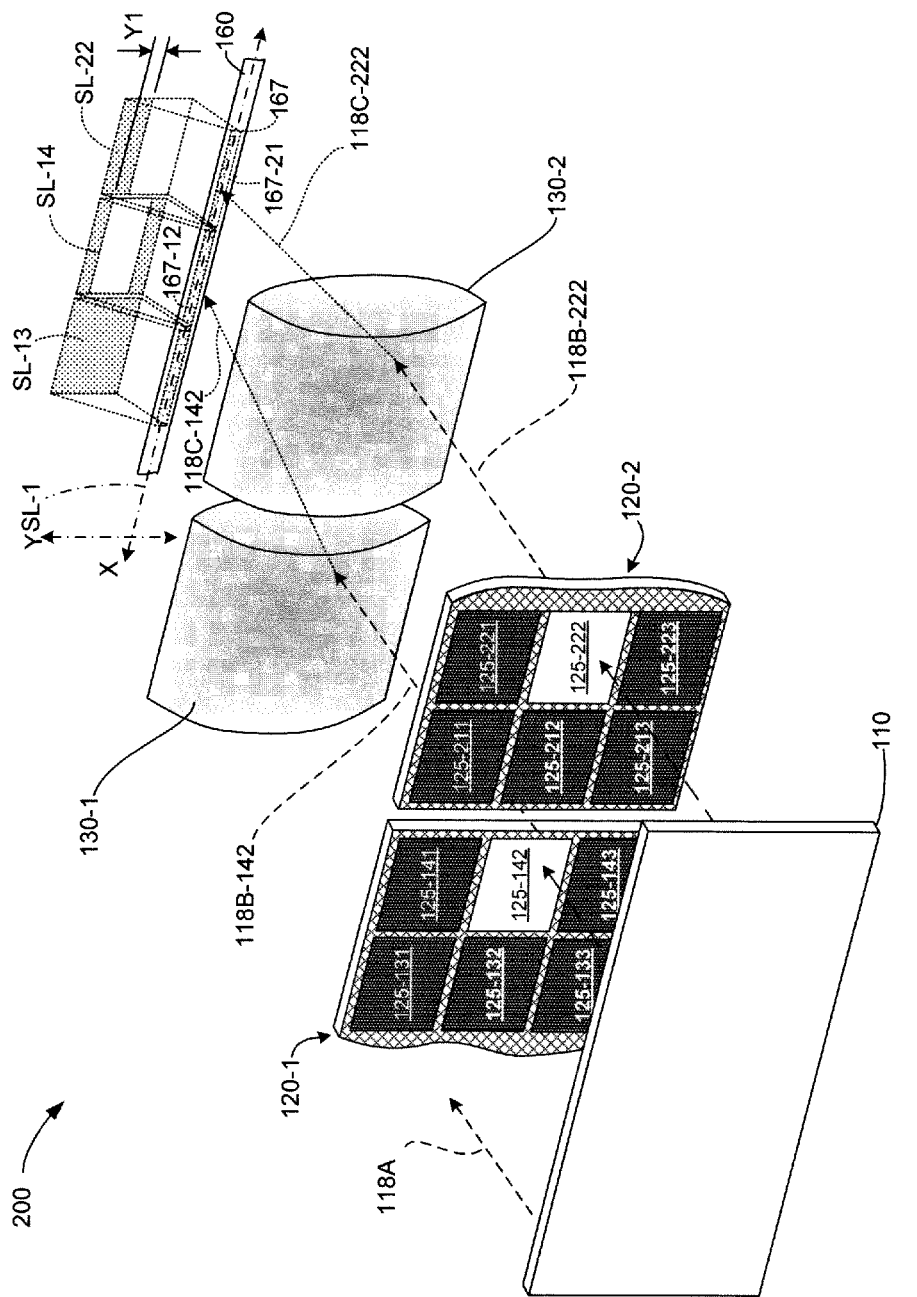
FIGS. 4(A) and 4(B) are partial perspective views showing a method for further modifying image data to adjust for vertical misalignment of adjacent spatial light modulators of the apparatus of FIG. 1 according to a specific embodiment of the present invention.
Figure 4B:
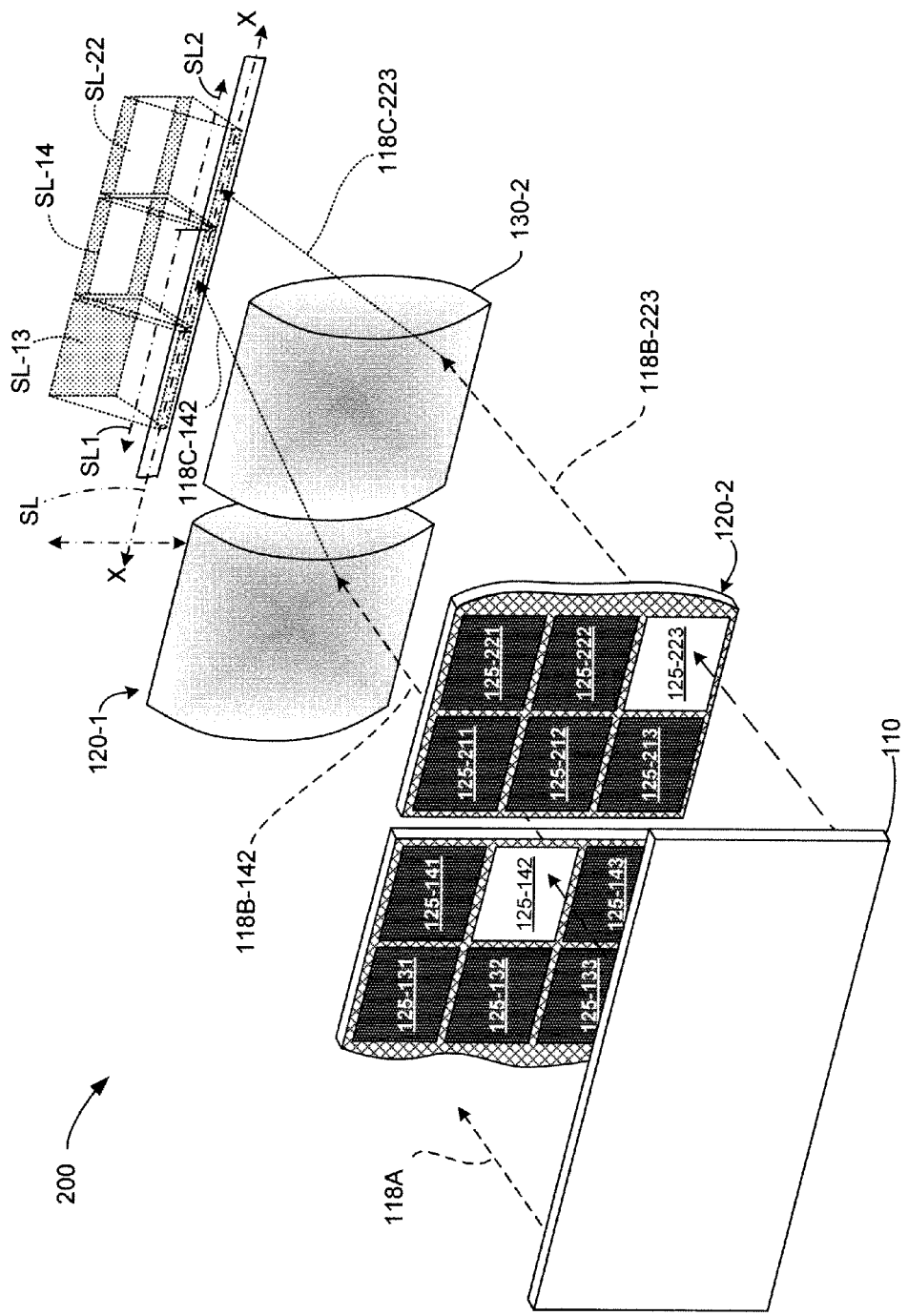

Referring to FIG. 4(A), according to an embodiment of the present invention, scan structure 160 is positioned such that imaging region 167 is displaced from the X-axis focal point of anamorphic optical system 130-1, whereby the cross-scan (Y-axis) position of scan line regions can be altered depending on which modulating elements in each column are in the "on" modulated state. In the example shown in FIG. 4(A), element 125-142 is located in a central position of its associated column, so the "white" portion of scan image region SL-12 is located in a central region of imaging region portion 167-12. Because element 125-141 is located in the upper position of its associated column, the "white" portion of scan image region SL-14 would be shifted downward in image region portion 167-12 if element 125-141 where on instead of element 125-142. Similarly, because element 125-143 is located in the lowermost position of its associated column, the "white" portion of scan image region SL-14 would be located in a upper portion of imaging region portion 167-12 if element 125-143 where on instead of element 125-142. According to another embodiment of the present invention, vertical (cross-scan) offsets between "pixels" generated by adjacent spatial light modulators 120-1 and 120-2, which can also occur during assembly, are corrected by modifying the image data group transmitted to one of spatial light modulators 120-1 or 120-2 such that the associated active modulating element data is shifted to a different row of modulating elements, whereby a feature of scan line image SL extending across scan line portions SL-1 and SL-2 is aligned in a cross-scan direction within elongated imaging region 167. This modification is illustrated with reference to the simplified example shown in FIG. 4(A) and FIG. 4(B), which shows the same portion of apparatus 200 described above with reference to FIGS. 3(A) and 3(B), and assumes the horizontal adjustment has already been addressed. That is, modulated light portions 118B-142 and 118B-222, which are respectively passed by element 125-142 of spatial light modulator 120-1 and element 125-222 of spatial light modulator 120-2 and concentrated by anamorphic optical systems 130-1 and 130-2 in the manner described above, produce two horizontally arranged white "dots" that are formed by scan line region SL-14 and scan line region SL-22. However, as shown in FIG. 4(A), the two horizontally arranged white "dots" are misaligned in the vertical (Y-axis) direction by an amount Y1 due to a slight misalignment during the assembly process. As illustrated in FIG. 4(B), this misalignment is addressed by electronically shifting the image data sent to spatial light modulator 120-2 downward, (i.e., such that the associated image data causes element 125-223 to turn "on" instead of element 125-222). Due to the realignment between modulated light portions 118B-142 and 118B-223, which are respectively passed by element 125-142 of spatial light modulator 120-1 and element 125-223 of spatial light modulator 120-2 and imaged and concentrated by anamorphic optical systems 130-1 and 130-2 in the manner described above, two vertically aligned white "dots" are formed in scan line region SL-14 and scan line region SL-22. By selectively shifting image data transferred to the spatial light modulators in this way, the resulting scan line portions SL-1 and SL-2 are stitched together and aligned in the cross-scan (Y-axis) direction to form a seamless elongated scan line image SL. In addition, once the necessary adjustment is determined, stitching data SD used by image stitching controller 170 (see FIG. 1) is updated to indicate that all image data transmitted to spatial light modulator 120-2 is shifted to the right one column and shifted upward one row, thereby effectively eliminating the horizontal/vertical overlap/displacement for all subsequent print/scan operations. Various components of apparatus 200 that are generally described above will now be described in additional detail with reference to certain specific exemplary embodiments.

Figure 5A:
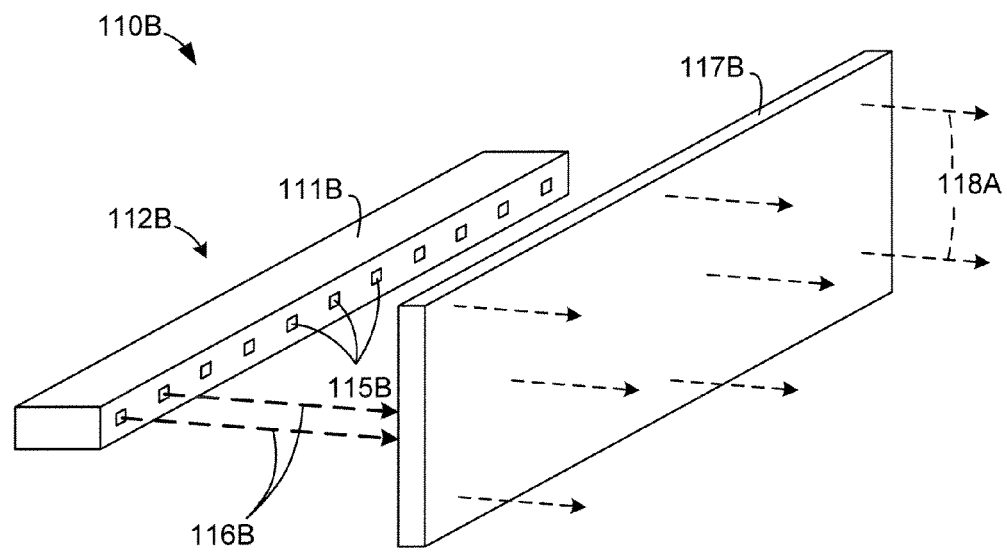
FIGS. 5(A) and 5(B) are simplified top and side views, respectively, showing alternative homogenous light generators utilized by imaging apparatus of FIG. 1 according to alternative embodiments of the present invention.
Figure 5B:
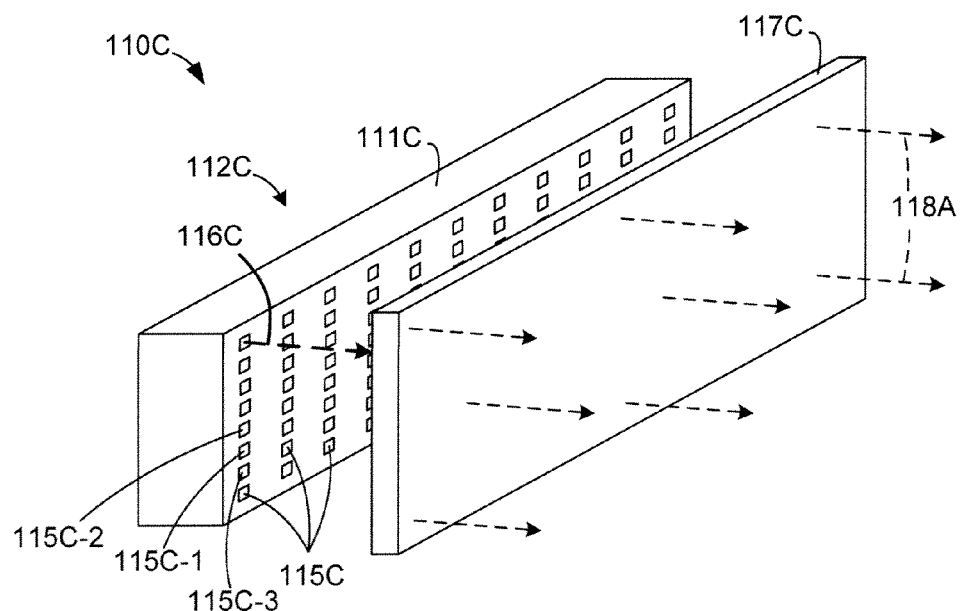

FIGS. 5(A) and 5(B) are simplified perspective views showing alternative homogenous light generators 110B and 110C according to exemplary specific embodiments of the present invention. Referring to FIG. 5(A), homogenous light generator 110B includes a light source 112B including one or more light generating elements (e.g., laser or light emitting diodes) 115B fabricated or otherwise disposed on a suitable carrier (e.g., a semiconductor substrate) 111B, and a light homogenizing optical system (homogenizer) 117B that produces homogenous light 118A by homogenizing light beam 116B (i.e., mixing and spreading out light beam 116B over an extended two-dimensional area). Those skilled in the art will recognize that this arrangement effectively converts the concentrated, relatively high energy intensity of light beams 116B generated by light generating elements 115B into dispersed, relatively low energy flux homogenous light 118A that is substantially evenly distributed onto modulating elements of the spatial light modulators.

One benefit of converting high energy beams 116B to relatively low energy homogenous light 118A in this manner is that this arrangement facilitates the use of a high energy light source (e.g., a laser) to generate beam 116B without requiring the construction of spatial light modulators 120-1 and 120-2 using special optical glasses and antireflective coatings that can handle the high energy light. That is, by utilizing homogenizer 117B to spread the high energy laser light out over an extended two-dimensional area, the intensity (Watts/cc) of the light over a given area (e.g., over the area of each modulating element 125-111 to 125-143, see FIG. 2) is reduced to an acceptable level such that low cost optical glasses and antireflective coatings can be utilized to form spatial light modulators 120-1 and 120-2. For example, when all of light modulating elements are turned "off", each of light modulating elements is required to absorb or reflect a relatively small portion of low energy homogenous light 118A. In contrast, in the absence of homogenizer 117B, most of the energy of beams 116B would be concentrated on one or a smaller number of elements, which would require the use of substantially more expensive optical glasses and antireflective coatings.

Another benefit of converting high energy beams 116B to relatively low energy homogenous light 118A is that this arrangement provides improved power handling capabilities. That is, if high energy laser beams 116B were passed directly to the spatial light modulators, then only one or a small number of modulating elements could be used to control how much energy is passed to anamorphic optical systems 130-1/2 (e.g., substantially all of the energy would be passed if the element was turned "on", or none would be passed if the element was turned "off"). By expanding high energy laser light 116B to provide low energy homogenous light 118A over a wide area, the amount of light energy passed by the spatial light modulators to the anamorphic optical systems is controlled with much higher precision.

According to alternative embodiments of the present invention, the light source utilized to generate the high energy beam can be composed of a single high power light generating element, or composed of multiple low power light generating elements that collectively produce the desired light energy. For high power homogenous light applications, the light source is preferably composed of multiple lower power light sources (e.g., edge emitting laser diodes or light emitting diodes) whose light emissions are mixed together by the homogenizer optics and produce the desired high power homogenous output. An additional benefit of using several independent light sources is that laser speckle due to coherent interference is reduced.

FIG. 5(A) illustrates a light source 112B according to a specific embodiment in which multiple edge emitting laser diodes 115B are arranged along a straight line that is disposed parallel to the rows of light modulating elements (not shown). In alternative specific embodiments, light source 112B consists of an edge emitting laser diode bar or multiple diode bars stacked together. These sources do not need to be single mode and could consist of many multimode lasers. Optionally, a fast-axis collimation (FAC) microlens could be used to help collimate the output light from an edge emitting laser.

FIG. 5(B) illustrates a light source 112C according to another specific embodiment in which multiple vertical cavity surface emitting lasers (VCSELs) 115C are arranged in a two-dimensional array on a carrier 111C. This two-dimensional array of VCSELS could be stacked in any arrangement such as hexagonal closed packed configurations to maximize the amount of power per unit area. Ideally such laser sources would have high plug efficiencies (e.g., greater than 50%) so that passive water cooling or forced air flow could be used to easily take away excess heat.

According to alternative embodiments of the present invention, light homogenizer 117B/C (which is shown in generalized form in FIGS. 5(A) and 5(B)) is implemented using one or more tapered light pipes, a microlens array, or any of several different additional technologies and methods known in the art.

Figure 6A:
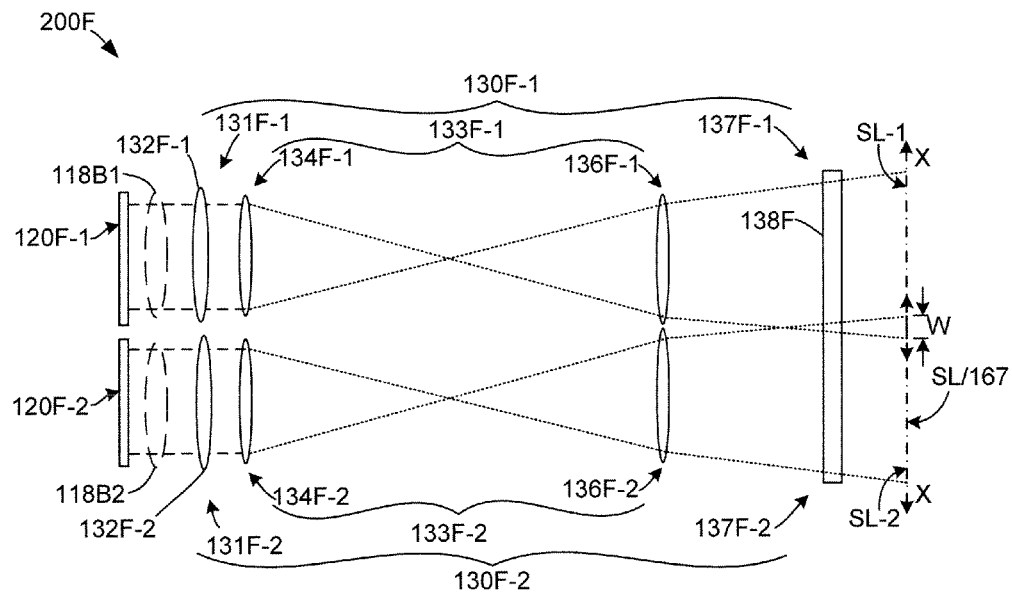
FIGS. 6(A) and 6(B) are simplified top and side views, respectively, showing an anamorphic optical system utilized by imaging apparatus of FIG. 1 according to a specific embodiment of the present invention.
Figure 6B:
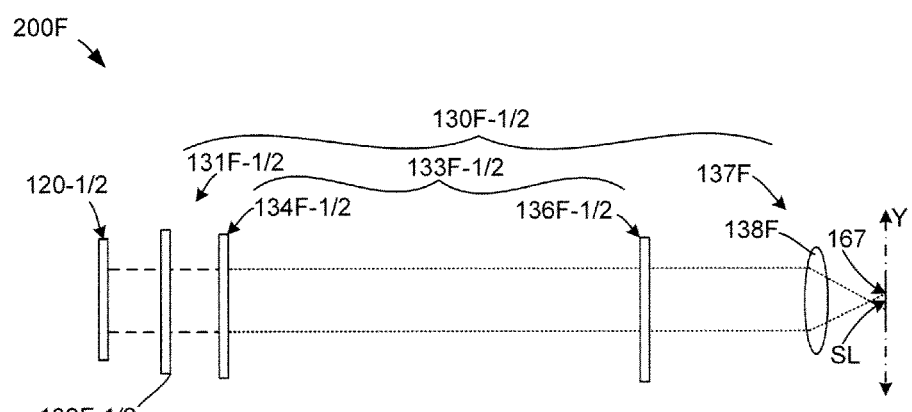

FIGS. 6(A) and 6(B) are top and side views depicting a portion of an imaging apparatus 200F including simplified anamorphic projection lens systems 130E-1 and 130E-2 according to an exemplary specific embodiment of the present invention. In the embodiment shown in FIGS. 6(A) and 6(B), each anamorphic projection lens system 130E-1 and 130E-2 includes an optional collimating optical subsystem 131F-1 and 131F-2, a two-lens cylindrical or acylindrical projection system 133F-1 and 133F-2 for magnifying light in the cross-process (scan) direction (i.e., along the X-axis), and a cylindrical or acylindrical focusing lens subsystem 137F-1 and 137F-2 for focusing light in the process (cross-scan) direction (i.e., along the Y-axis). Note that focusing lens subsystem 137F-1 and 137F-2 can be formed as a single lens or can be two separate lenses (as illustrated) using skills known in the art. As indicated by the ray traces in FIGS. 6(A) and 6(B), optical subsystems 131F-1/2, 133F-1/2 and 137F-1/2 are disposed in the optical path between spatial light modulators 120E-1/2 and scan line SL, which is generated at the output of imaging system 200F. FIG. 6(A) is a top view indicating that collimating optical subsystem 131F-1/2 and cross-process optical subsystems 133F-1/2 act on the light portions passed by spatial light modulators 120-1/2 to direct the light along scan line image SL parallel to the X-axis (i.e., in the cross-process direction), and FIG. 6(B) is a side view that indicates how collimating optical subsystem 131F-1/2 and process-direction optical subsystems 137F-1/2 act on the light portions passed by spatial light modulators 120-1/2 to focus the light on scan line image SL (i.e., perpendicular to the Y-axis, or process direction).

Collimating optical subsystems 131F-1 and 131F-2 respectively include a collimating field lens 132F-1 and 132F-2 formed in accordance with known techniques that is located immediately after spatial light modulators 120E-1 and 120E-2, and is arranged to collimate the light portions that are slightly diverging off of the surface of the spatial light modulators 120E-1 and 120E-2. Collimating optical subsystems 131F-1 and 131F-2 are optional, and may be omitted when modulated light portions 118B1 and 118B2 leaving spatial light modulator 120E-1 and 120E-2 are already well collimated.

Each two-lens cylindrical or acylindrical projection system 133F-1 and 133F-2 includes a first cylindrical or acylindrical lens 134F-1/2 and a second cylindrical or acylindrical lens 136F-1/2 that are arranged to project and magnify the light portions (imaging data) passed by associated spatial light modulators 120E-1 and 120E-2 onto imaging surface 167, which coincides with scan line SL. By producing a slight fanning out (spreading) of the light along the X-axis as indicated in FIG. 6(A), the scan line image produces the desired overlap W without mechanical interference between the adjacent optical subsystems. The advantage of this arrangement is that it allows the intensity of the light (e.g., laser) power to be concentrated on scan line SL.

According to an embodiment of the invention, lens subsystems 137F-1/2 share a third cylindrical or acylindrical lens 138F that concentrates the projected imaging data down to a narrow high resolution line image on imaging surface 167. Lens 138F must be high performance and have a high numerical aperture. Lenses 138F-1 and 138F-2 can be formed from as single lenses or can be two lenses positioned side by side. The two lens version will have to be positioned far enough from the image plane to avoid mechanical interference with the adjacent lens (or lenses). As the focusing power of lenses 138F-1 and 138F-2 is increased, the intensity of the light on spatial light modulators 120E-1 and 120E-2 is reduced relative to the intensity of scan line image SL at imaging surface 167. However, this means that cylindrical or acylindrical lenses 138F-1 and 138F-2 must be placed closer to imaging surface 167 with a clear aperture extending to the very edges of lenses 138F-1 and 138F-2. Although single lenses 138F-1 and 138F-2 is indicated in the illustrated embodiment, two more separate lenses may be utilized to produce the desired image concentration of lens subsystems 137F-1/2.

Referring to the right side of to FIG. 1, according to a specific embodiment of the present invention, apparatus 200 is a printer or scanner in which imaging drum cylinder 160 is coated with a fountain solution that is evaporated on the imaging surface heated by anamorphically imaged and concentrated modulated light fields 119C-1 and 119C-2, which are defined by the collection of anamorphically imaged and concentrated modulated light portions 118C-1 and 118C-2 imaged and concentrated by anamorphic optical systems 130-1 and 130-2, respectively. That is, instead of the selective application of ink by a plate and subsequent transfer of the ink to paper, as in standard offset lithography, the ink is generally applied to a the imaging surface over a fountain solution that has been selectively evaporated on the plate surface heated by modulated light fields 119C-1 and 119C-2. In this apparatus, only the dry (evaporated) areas of the imaging surface will have ink transferred to it. The ink will subsequently be transferred to paper or other receiving media. Thus, variable data from evaporation is transferred, instead of constant data from the plate as in conventional systems. For this process to work using a rastered light source (i.e., a light source that is rastered back and forth across the scan line), a single very high power light (e.g., laser) source would be required to sufficiently ablate the water solution in real time. The benefit of the present invention is that, because fountain solution liquid is evaporated from the entire scan line simultaneously, an offset press configuration is provided at high speed using multiple relatively low power light sources.

According to alternative specific embodiments of the present invention, spatial light modulators 120-1 and 120-2 (see FIG. 1) are implemented using commercially available devices including a digital micromirror device (DMD), such as a digital light processing (DLP®) chip available from Texas Instruments of Dallas Tex., USA, an electro-optic diffractive modulator array such as the Linear Array Liquid Crystal Modulator available from Boulder Nonlinear Systems of Lafayette, Colo., USA, or an array of thermo-optic absorber elements such as Vanadium dioxide reflective or absorbing mirror elements. Other spatial light modulator technologies may also be used. While any of a variety of spatial light modulators may be suitable for a particular application, many print/scanning applications today require a resolution 1200 dpi and above, with high image contrast ratios over 10:1, small pixel size, and high speed line addressing over 30 kHz. Based on these specifications, the currently preferred spatial light modulator is the DLP™ chip due to its best overall performance.

Figure 7:
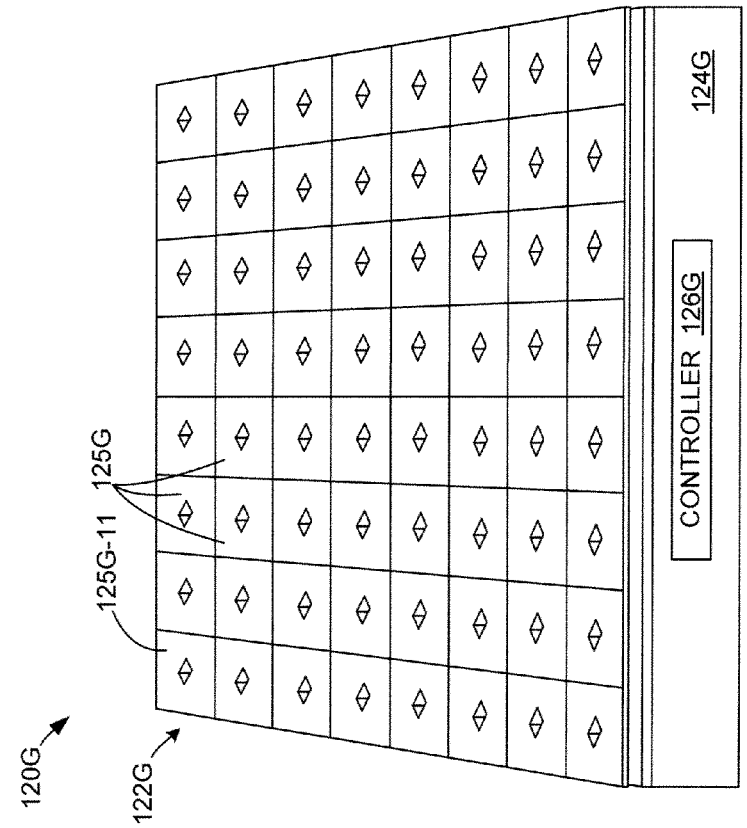
FIG. 7 is a perspective view showing a portion of a DMD-type spatial light modulator utilized by the apparatus of FIG. 1 according to a specific embodiment of the present invention.

FIG. 7 is a perspective view showing a portion of a DMD-type spatial light modulator 120G that is utilized in accordance with a specific embodiment of the present invention, and includes a modulating element array 122G made up of multiple microelectromechanical (MEMs) mirror mechanisms 125G. Modulating element array 122G is consistent with DMDs sold by Texas Instruments, wherein MEMs mirror mechanisms 125G are arranged in a rectangular array on a semiconductor substrate (i.e., "chip" or support structure) 124G. Mirror mechanisms 125G are controlled as described below by a controller circuit 126G that also is fabricated on substrate 124G according to known semiconductor processing techniques, and is disposed below mirrors 125G. Although only sixty-four mirror mechanisms 125G are shown in FIG. 7 for illustrative purposes, those skilled in the art will understand that any number of mirror mechanisms are disposed on DMD-type modulating element array 122G, and that DMDs sold by Texas Instruments typically include several hundred thousand mirrors per device.

Figure 8:
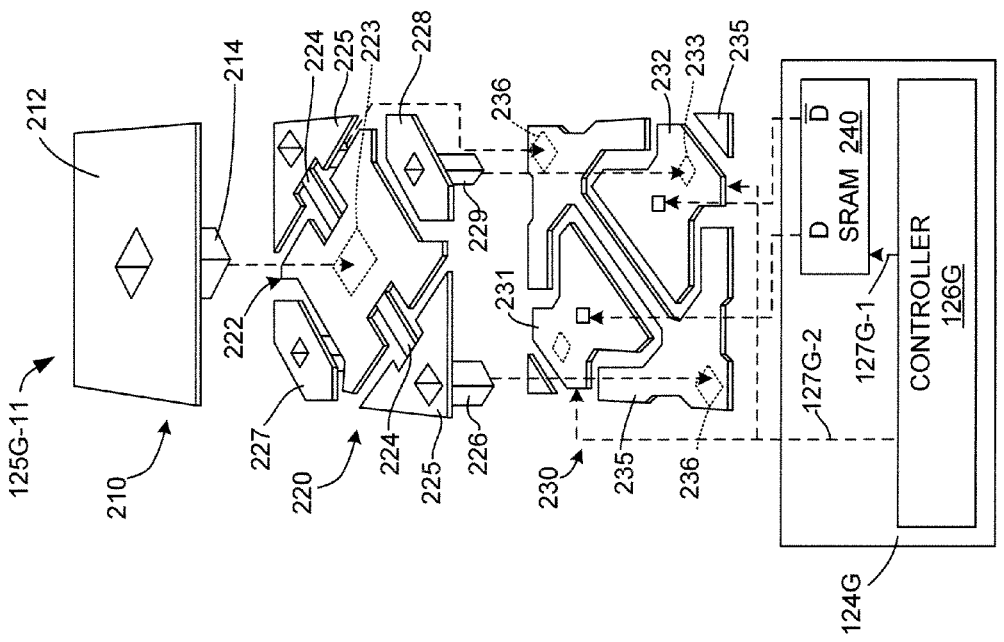
FIG. 8 is an exploded perspective view showing a light modulating element of the DMD-type spatial light modulator of FIG. 7 in additional detail.

FIG. 8 is a combination exploded perspective view and simplified block diagram showing an exemplary mirror mechanism 125G-11 of DMD-type modulating element array 122G (see FIG. 7) in additional detail. For descriptive purposes, mirror mechanism 125G-11 is segmented into an uppermost layer 210, a central region 220, and a lower region 230, all of which being disposed on a passivation layer (not shown) formed on an upper surface of substrate 124G. Uppermost layer 210 of mirror mechanism 125G-11 includes a square or rectangular mirror (light modulating structure) 212 that is made out of aluminum and is typically approximately 16 micrometers across. Central region 220 includes a yoke 222 that connected by two compliant torsion hinges 224 to support plates 225, and a pair of raised electrodes 227 and 228. Lower region 230 includes first and second electrode plates 231 and 232, and a bias plate 235. In addition, mirror mechanism 125G-11 is controlled by an associated SRAM memory cell 240 (i.e., a bi-stable flip-flop) that is disposed on substrate 124G and controlled to store either of two data states by way of control signal 127G-1, which is generated by controller 126G in accordance with image data as described in additional detail below. Memory cell 240 generates complementary output signals D and D-bar that are generated from the current stored state according to known techniques.

Lower region 230 is formed by etching a plating layer or otherwise forming metal pads on a passivation layer (not shown) formed on an upper surface of substrate 124G over memory cell 240. Note that electrode plates 231 and 232 are respectively connected to receive either a bias control signal 127G-2 (which is selectively transmitted from controller 126G in accordance with the operating scheme set forth below) or complementary data signals D and D-bar stored by memory cell 240 by way of metal vias or other conductive structures that extend through the passivation layer.

Central region 220 is disposed over lower region 230 using MEMs technology, where yoke 222 is movably (pivotably) connected and supported by support plates 225 by way of compliant torsion hinges 224, which twist as described below to facilitate tilting of yoke 222 relative to substrate 124G. Support plates 225 are disposed above and electrically connected to bias plate 235 by way of support posts 226 (one shown) that are fixedly connected onto regions 236 of bias plate 235. Electrode plates 227 and 228 are similarly disposed above and electrically connected to electrode plates 231 and 232, respectively, by way of support posts 229 (one shown) that are fixedly connected onto regions 233 of electrode plates 231 and 232. Finally, mirror 212 is fixedly connected to yoke 222 by a mirror post 214 that is attached onto a central region 223 of yoke 222.

FIGS. 9(A) to 9(C) are perspective/block views showing mirror mechanism 125G-11 of FIG. 7 during operation. FIG. 9(A) shows mirror mechanism 125G-11 in a first (e.g., "on") modulating state in which received light portion 118A-G becomes reflected (modulated) light portion 118B-G1 that leaves mirror 212 at a first angle θ1. To set the "on" modulating state, SRAM memory cell 240 stores a previously written data value such that output signal D includes a high voltage (VDD) that is transmitted to electrode plate 231 and raised electrode 227, and output signal D-bar includes a low voltage (ground) that is transmitted to electrode plate 232 and raised electrode 228. These electrodes control the position of the mirror by electrostatic attraction. The electrode pair formed by electrode plates 231 and 232 is positioned to act on yoke 222, and the electrode pair formed by raised electrodes 227 and 228 is positioned to act on mirror 212. The majority of the time, equal bias charges are applied to both sides of yoke 222 simultaneously (e.g., as indicated in FIG. 9(A), bias control signal 127G-2 is applied to both electrode plates 227 and 228 and raised electrodes 231 and 232). Instead of flipping to a central position, as one might expect, this equal bias actually holds mirror 122 in its current "on" position because the attraction force between mirror 122 and raised electrode 231/electrode plate 227 is greater (i.e., because that side is closer to the electrodes) than the attraction force between mirror 122 and raised electrode 232/electrode plate 228.

To move mirror 212 from the "on" position to the "off" position, the required image data bit is loaded into SRAM memory cell 240 by way of control signal 127G-1 (see the lower portion of FIG. 9(A). As indicated in FIG. 9(A), once all the SRAM cells of array 122G have been loaded with image data, the bias control signal is de-asserted, thereby transmitting the D signal from SRAM cell 240 to electrode plate 231 and raised electrode 227, and the D-bar from SRAM cell 240 to electrode plate 232 and raised electrode 228, thereby causing mirror 212 to move into the "off" position shown in FIG. 9(B), whereby received light portion 118A-G becomes reflected light portion 118B-G2 that leaves mirror 212 at a second angle θ2. In one embodiment, the flat upper surface of mirror 212 tilts (angularly moves) in the range of approximately 10 to 12° between the "on" state illustrated in FIG. 9(A) and the "off" state illustrated in FIG. 9(B). When bias control signal 127G-2 is subsequently restored, as indicated in FIG. 9(C), mirror 212 is maintained in the "off" position, and the next required movement can be loaded into memory cell 240. This bias system is used because it reduces the voltage levels required to address the mirrors such that they can be driven directly from the SRAM cells, and also because the bias voltage can be removed at the same time for the whole chip, so every mirror moves at the same instant.

As indicated in FIGS. 9(A) to 9(C), the rotation torsional axis of mirror mechanism 125G-11 causes mirrors 212 to rotate about a diagonal axis relative to the x-y coordinates of the DLP chip housing. This diagonal tilting requires that the incident light portions received from the spatial light modulator be projected onto each mirror mechanism 125G at a compound incident angle so that the exit angle of the light is perpendicular to the surface of the DLP chip. This requirement complicates the side by side placement of DMD-type spatial light modulator 120G relative to the other components (e.g., the associated anamorphic optical system) within an imaging apparatus.

Figure 10:
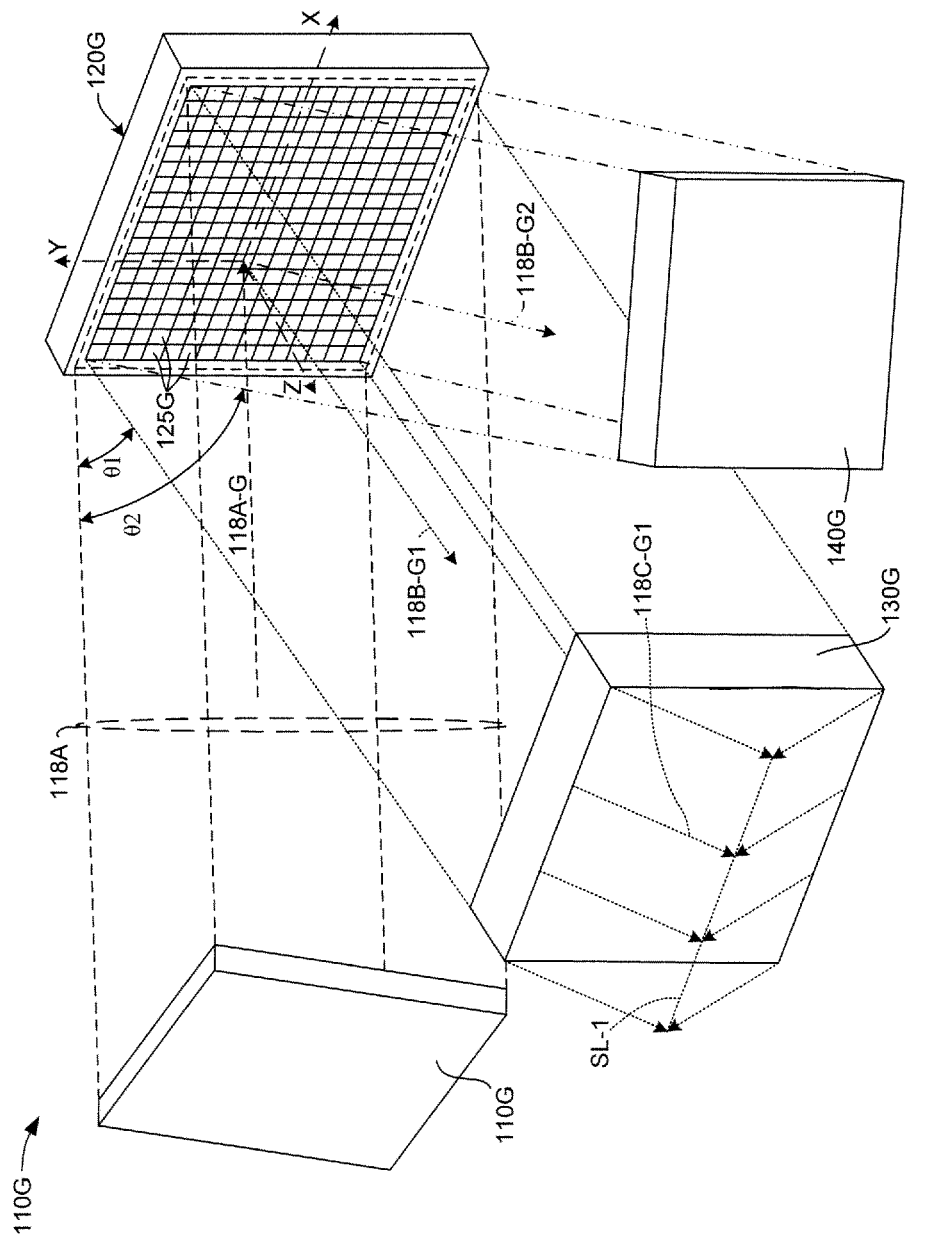
FIG. 10 is a simplified diagram showing a portion of an imaging apparatus including the DMD-type spatial light modulator of FIG. 7 in a folded arrangement according to a specific embodiment of the present invention.

FIG. 10 is a simplified perspective view showing a portion of an imaging apparatus 200G including a DMD-type spatial light modulator 120G-1, which is similar to spatial light modulator 120G described above with reference to FIGS. 7-9), where DMD-type spatial light modulator 120G-1 is disposed in a preferred "folded" arrangement according to another embodiment of the present invention. Similar to the generalized apparatus 200 discussed above with reference to FIG. 1, imaging apparatus 200G includes a homogenous light generator 110G and an associated anamorphic optical system 130G-1 that function and operate as described above. Imaging apparatus 200G is distinguished from the generalized system in that spatial light modulator 120G-1 is positioned relative to homogenous light generator 110G and anamorphic optical system 130G-1 at a compound angle such that incident homogenous light 118A is neither parallel nor perpendicular to any of the orthogonal axes X, Y or Z defined by the surface of spatial light modulator 120G-1, and the reflected light portions 118B-G1 and 118B-G2 (respectively produced when the mirrors are in the "on" and "off" positions as described above) are directed substantially normal or perpendicular to the surface of spatial light modulator 120G along the Z direction through the anamorphic projection optical system 130G in the "on" mirror position, and directed outside of the anamorphic projection optical system 130G to a light absorbing beam stop 140G in the "off" mirror position. With the components of imaging apparatus 200G positioned in this "folded" arrangement, portions of homogenous light 118A-G directed to spatial light modulator 120G-1 from homogenous light generator 110G are reflected from each MEMs mirror mechanism 125G to anamorphic optical system 130G-1 only when the mirrors of each MEMs mirror mechanism 125G are in the "on" position (e.g., as described above with reference to FIG. 9(A)). That is, as indicated in FIG. 10, each MEMs mirror mechanism 125G that is in the "on" position reflects an associated one of light portions 118B-G1 at angle θ1 relative to the incident light direction, whereby modulated light portions 118B-G1 are directed by spatial light modulator 120G-1 along corresponding predetermined directions to anamorphic optical system 130G-1, which is positioned and arranged to direct concentrated light portions 118C-G1 onto scan line portion SL-1, where scan line portion SL-1 is perpendicular to the Z-axis defined by the surface of spatial light modulator 120G-1 and the scan line SL-1 is parallel to the X-axis. Conversely, each MEMs mirror mechanism 125G that is in the "off" position reflects an associated one of light portions 118A-G at angle θ2, whereby modulated light portions 118B-G2 are directed by spatial light modulator 120G away from anamorphic optical system 130G-1. According to an aspect of the preferred "folded" arrangement, imaging apparatus 200G includes a beam stop heat sink structure 140G-1 that is positioned to receive modulated light portions 118B-G2 that are reflected by MEMs mirror mechanisms 125G in the "off" position. According to another aspect of the preferred "folded" arrangement using the compound incident angle design set forth above, the components of imaging apparatus 200G are arranged in a manner that facilitates the construction of a seamless assembly including any number of identical imaging systems, such as described below with reference to FIG. 13.

Figure 11:
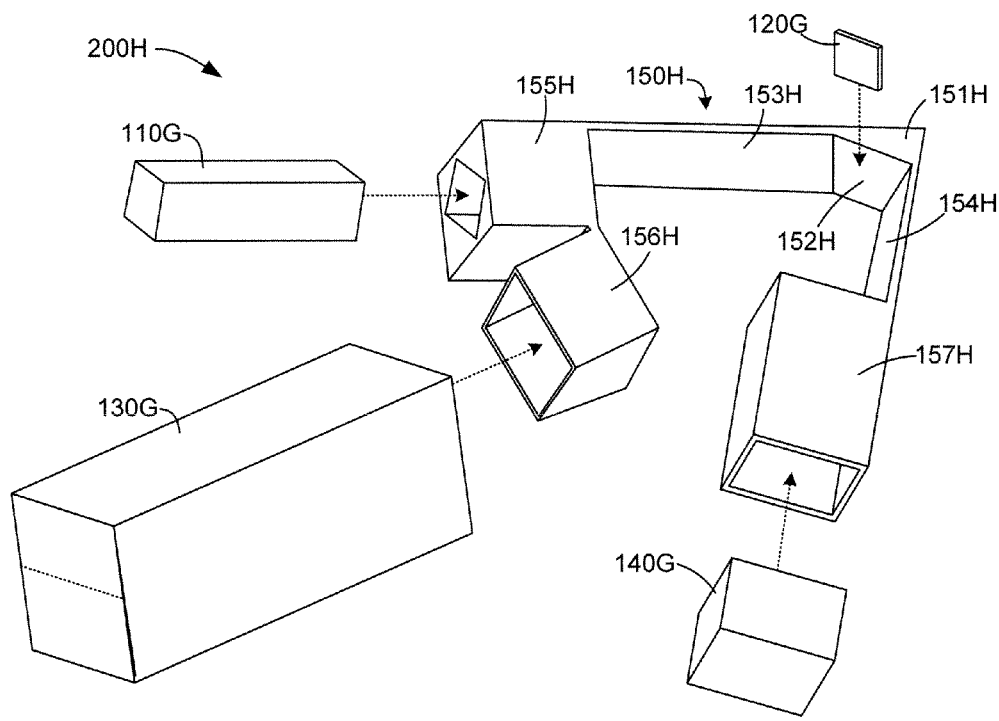
FIG. 11 is an exploded perspective view showing a portion of another imaging apparatus utilizing the DMD-type spatial light modulator in the folded arrangement according to another specific embodiment of the present invention.
Figure 12:
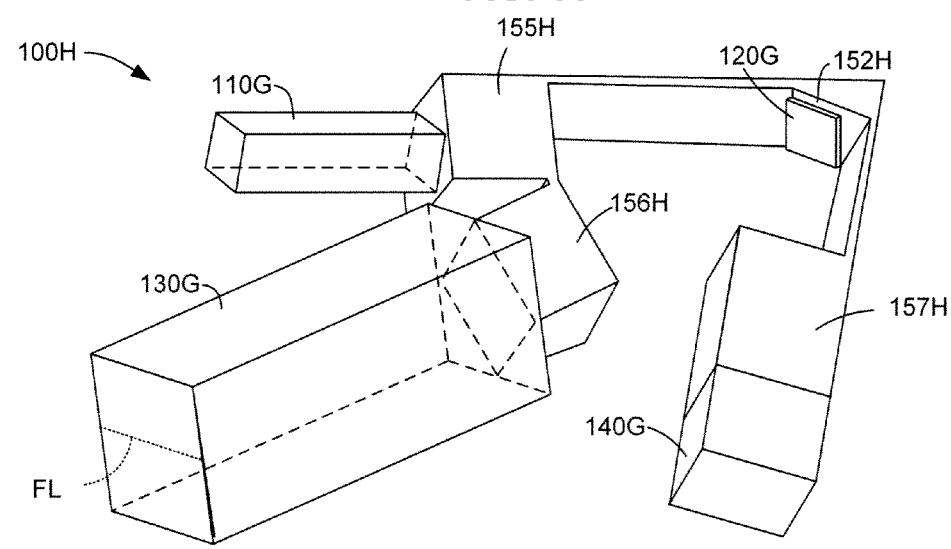
FIG. 12 is a perspective view showing the imaging apparatus portion of FIG. 11 in an assembled state.

FIGS. 11 and 12 are simplified exploded and assembled perspective views, respectively, showing a portion of imaging apparatus 200H including the components shown in FIG. 10, and further including a rigid frame 150H according to another embodiment of the present invention. The purpose of frame 150H is to facilitate low-cost assembly and to maintain the system components in the preferred "folded" arrangement (discussed above with reference to FIG. 10). In addition, as discussed below with reference to FIG. 13, the disclosed design of frame 150H facilitates forming a larger assembly.

Referring to FIG. 11, frame 150H is a single piece structure that is molded or otherwise formed from a suitable rigid material (e.g., a hard plastic such as polycarbonate, or a metal such as aluminum, and generally includes an angled base portion 151H defining a support area 152H, a first arm 153H and a second arm 154H that extend from base portion on opposite sides of support area 152H, a first box-like bracket 155H integrally attached to an end of first arm 153H, a second box-like bracket 156H integrally attached to first bracket 155H, and a third bracket 157H attached to an end of second arm 153H. As indicated in FIGS. 11 and 12, support area 152H is shaped and arranged to facilitate mounting of DMD-type spatial light modulator 120G in a predetermined orientation, and brackets 155H, 156H and 157H are positioned and oriented to receive operating ends of homogenous light generator 110G, anamorphic optical system 130G and heat sink 140G, respectively, such that these elements are properly oriented with DMD-type spatial light modulator 120G when fixedly secured thereto.

Figure 13:
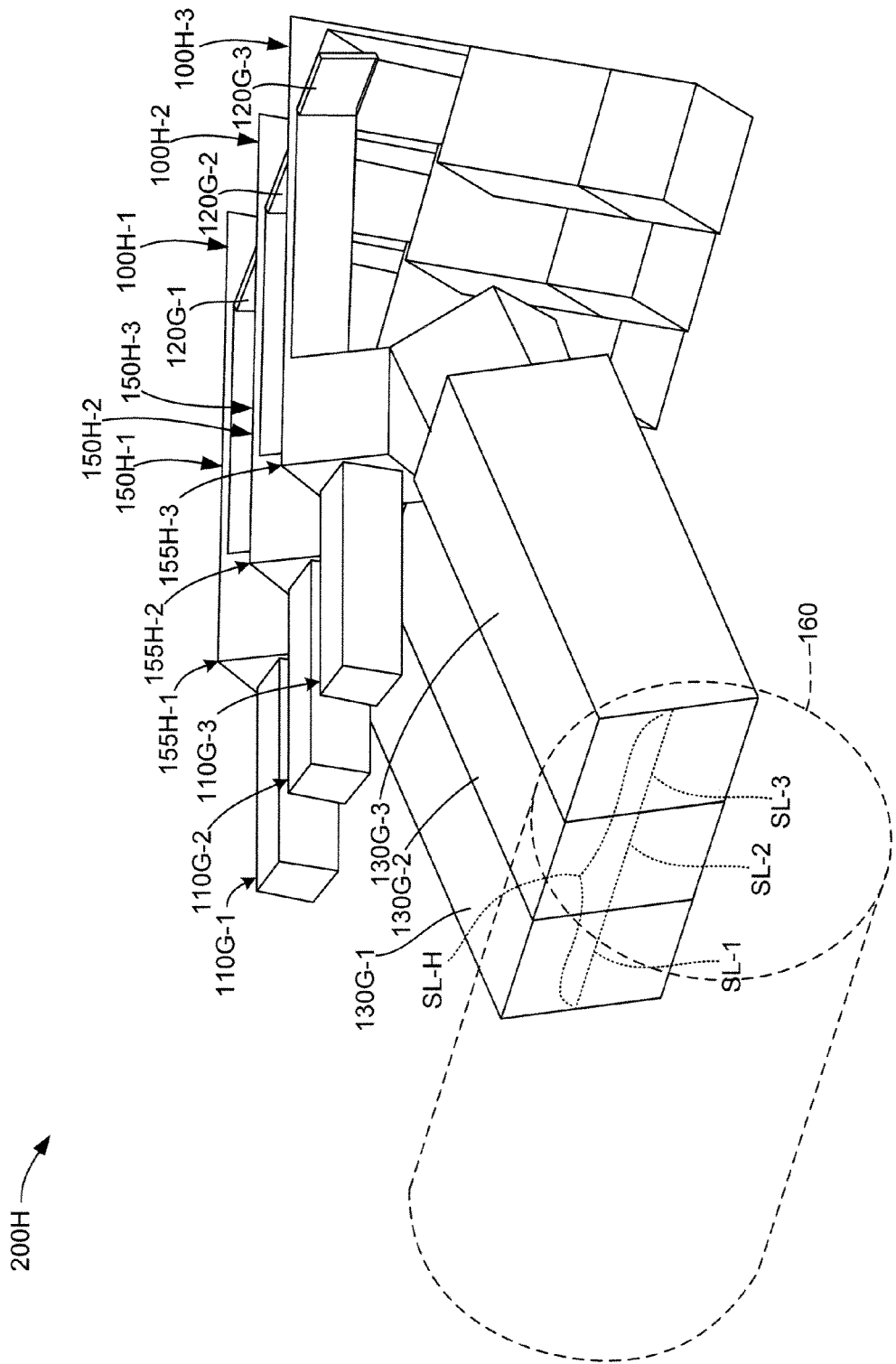
FIG. 13 is a perspective view showing an imaging apparatus according to another specific embodiment of the present invention.

FIG. 13 is a simplified perspective view showing an apparatus 200L made up of a series of three imaging subsystems 100H-1, 100H-2 and 100H-3 that are stacked across the width of an imaging area (i.e., a surface coincident with or parallel to elongated scan line image SL-H) according to another embodiment of the present invention. Each imaging subsystem 100H-1, 100H-2 and 100H-3 includes an associated frame 150H-1, 150H-2 and 150H-3, an associated homogenous light source 110G-1, 110G-2 and 110G-3 respectively attached to first brackets 155H-1, 155H-2 and 155H-3 of each frame 150H-1, 150H-2 and 150H-3, an associated DMD-type spatial line modulator 120G-1, 120G-2 and 120G-3, an associated anamorphic optical system 130G-1, 130G-2 and 130G-3, and an associated heat sink 140G-1, 140G-2 and 140G-3 arranged in a manner consistent with that described above with reference to FIGS. 11 and 12. Imaging subsystems 100H-1, 100H-2 and 100H-3 are arranged such that anamorphic optical system 130G-1 to 130G-3 are fixedly connected in a side-by-side arrangement, and such that scan line sections SL-1 to SL-3 are substantially collinear and form an elongated scan line SL-H on scan structure 160.

Although apparatus 200L is shown with only three subsystems 100H-1, 100H-2 and 100H-3, the illustrated arrangement clearly shows that the folded arrangement described above with reference to FIGS. 10-12 facilitates assembling any number of imaging systems to form a focal (scan) line having any length. That is, one advantage provided by the folded arrangement of each subsystem associated with apparatus 200L is that each optical subsystems 100H-1 to 100H-3 can be manufactured using mass-produced, readily available components (e.g., DMD chips produced by Texas Instruments) so that each subsystem can benefit from price reductions coming from volume manufacturing. There is currently no single spatial light modulator device that can be utilized in the imaging system of the present invention that has sufficient size to generate a scan line of 20 inches or more in the cross process direction with sufficient resolution (e.g., 1200 dots-per-inch). By producing multiple optical subsystems (e.g., optical subsystems 100H-1 to 100H-3) using currently commercially available DMD-type spatial light modulator devices, arranging the subsystem components using the folded arrangement described herein, and stacking the subsystems in the manner shown in FIG. 13, an economical apparatus can be produced that provides a scan line of essentially any width.

A possible limitation to the imaging apparatus of the present invention described above is that particular spatial light modulators may not provide sufficient scan line resolution. That is, the spatial light modulators of the various embodiments described above include arrangements in which the rows and columns of light modulating elements are disposed orthogonal to the focal/scan line (i.e., such that the light portions directed by all light modulating elements in each column in the "on" position are summed on a single imaging region of the focal/scan line). This orthogonal arrangement may present a problem when the desired resolution for a given application is greater than the modulating element resolution (i.e., the center-to-center distance between adjacent elements in a row) of a given spatial light modulator. For example, many photolithography printing applications require resolutions of 1200 dpi or greater, but a standard DLP chip includes a mirror array having 1024 columns of mirrors spaced at 13.68 μm which forms 600 pixels per inch in the fast scan direction when using a projection lens with a magnification of 3.0945, thereby limiting the resolution of an image system using the orthogonal arrangement to a resolution of 600 dpi.

Figure 14:
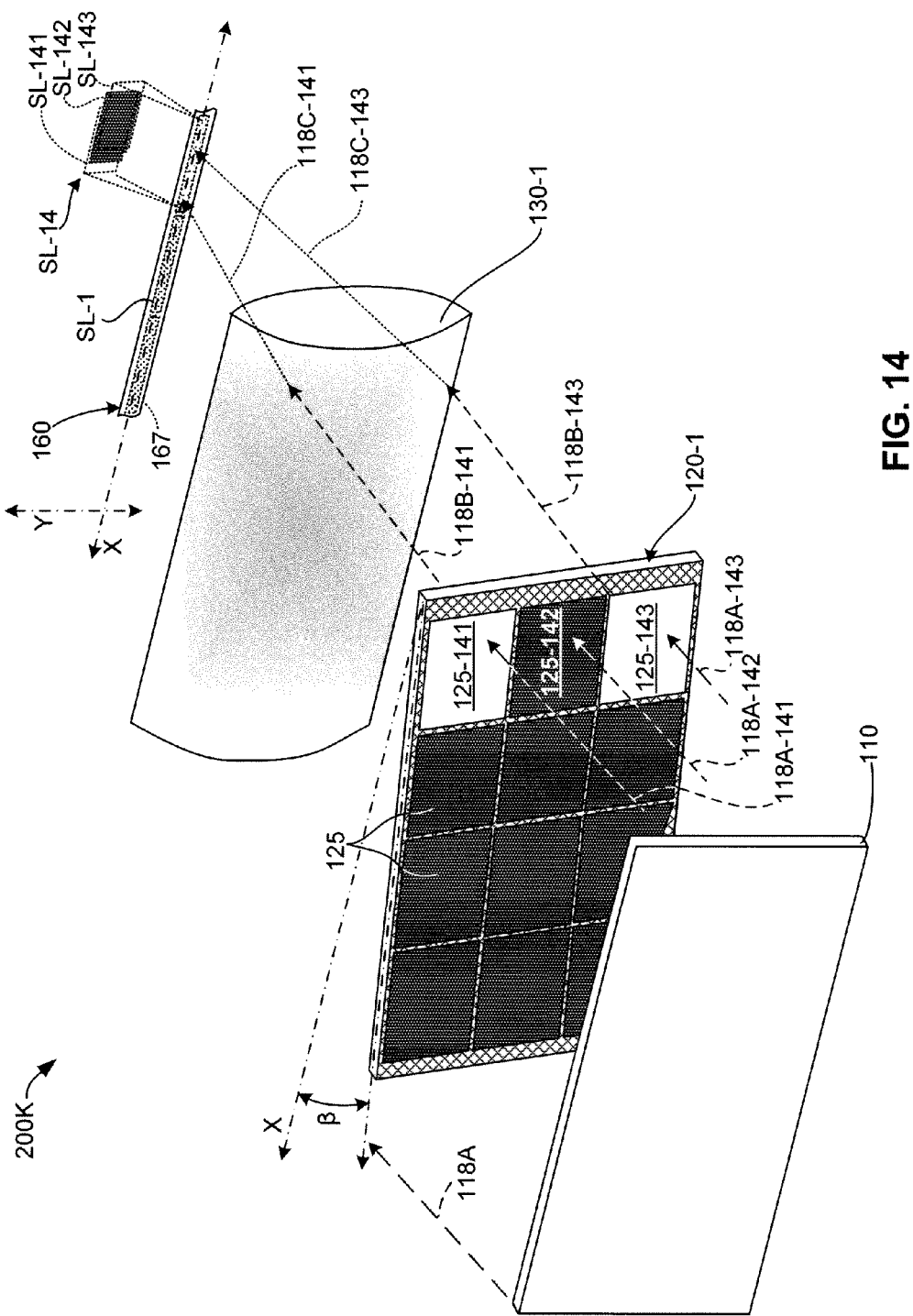
FIG. 14 is a perspective view showing a portion of another imaging apparatus including a tilted spatial light modulator according to another specific embodiment of the present invention.

FIG. 14 is a perspective view showing a portion of a single-pass imaging apparatus 200K according to another embodiment of the present invention that addresses the potential problems associated with the orthogonal arrangement set forth above. Similar to generalized imaging apparatus 200 (discussed above with FIG. 1), imaging apparatus 200K generally includes homogenous light generator 110, a spatial light modulator 120-1, an associated anamorphic optical (e.g., projection lens) system 130-1 and a scan structure 160 that operate substantially as discussed above. However, imaging apparatus 200K differs from the generalized imaging system in that spatial light modulator 120-1 is tilted relative to anamorphic optical system 130-1 such that the rows of modulating elements 125 are aligned at an acute tilt angle β relative to scan line SL-1, whereby the elements in each column are slightly displaced in the horizontal (X-axis) direction such that anamorphic optical system 130-1 focuses each modulated light portion onto an associated horizontally displaced sub-imaging region of elongated imaging region 167 of scan structure 160. In the example shown in FIG. 4(A), elements 125-141 and 125-143 are in the "on" modulated state, whereby homogenous light portions 118A-141 and 118A-143 are passed as modulated light portions 118B-141 and 118B-143 to anamorphic optical system 130-1, and elements 125-111 and 125-133 and 125-142 are in the "off" modulated state, whereby their received homogenous light portions (e.g., 118A-142) are prevented from passing to anamorphic optical system 130-1. Due to the tilt angle β, concentrated light portions 118C-141 and 118C-143 are directed by anamorphic optical system 130-1 onto sub-imaging regions SL-141 to SL-143, respectively, of scan line region SL-4 (sub-imaging region SL-142 remains "dark" due to the "off" state of element 125-142).

Figure 15:
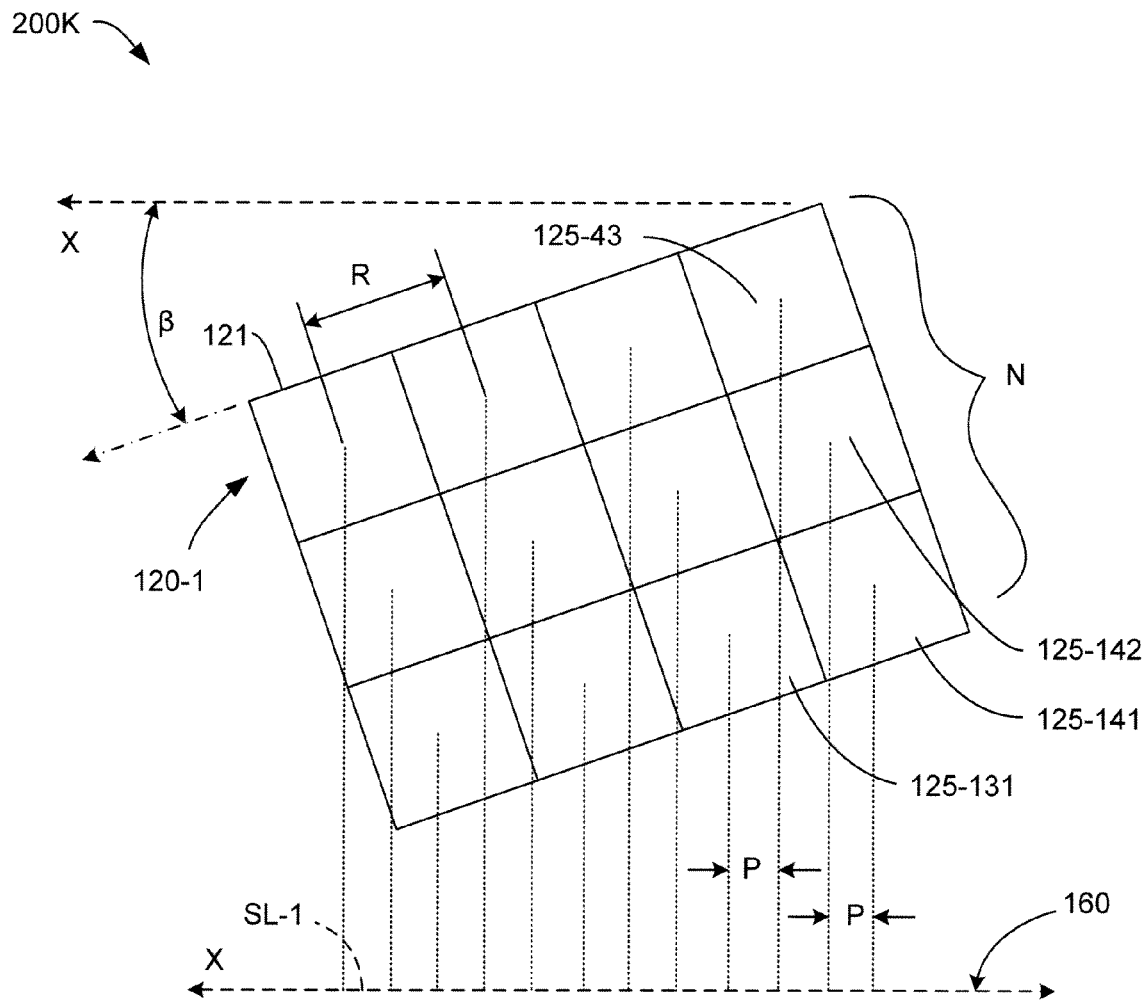
FIG. 15 is a simplified diagram depicting the tilted spatial light modulator of FIG. 14 during operation.

As indicated in FIG. 15, which is a simplified diagram depicting the tilted orientation of a top edge 121 of spatial light modulator 120-1 and scan line portion SL-1 (which extends in the X-axis direction), according to an aspect of the present embodiment, tilt angle β is selected such that the centers of each modulating elements 125-111 to 125-143 are equally spaced along the X-axis direction, whereby each light portion passed through each modulating elements 125-111 to 125-143 is directed onto a corresponding unique sub-imaging region of scan line portion SL-1. That is, tilt angle β is selected such that the centers of each modulating element 125-111 to 125-143 (indicated by vertical dashed lines) are separated by a common pitch P along scan line portion SL-1 (e.g., the centers of modulating elements 125-141 and 125-142 and the centers of modulating element 125-143 and 125-131 are separated by the same pitch distance P). In one embodiment, in order to equalize the pitch distance P for all modulating elements of spatial light modulator 120, tilt angle β is set equal to the arctangent of 1/n, where n is the number of modulating elements in each column (that is, for the simplified example, n=3), giving a uniform pitch distance P that is equal to the R/n, where R is the modulating element resolution determined by the center-to-center distance between adjacent modulating elements in each row.

Referring again to FIG. 14, due to the tilted orientation of spatial light modulator 120-1 relative to scan line portion SL-1, the centers of modulating elements 125-141 to 125-143 are sequentially shifted to the right along the X-axis direction (i.e., the center of modulating element 125-141 is slightly to the left of the center of modulating element 125-142, which in turn is slightly to the left of the center of modulating element 125-143). Referring to the upper right portion of FIG. 14, the slight offset between the light modulating elements in each column causes anamorphic optical system 130 to focus the light portions received from each light modulating element such that the light is centered on an associated unique sub-imaging region of scan line portion SL-1. For example, light portions 118B-141 and 118B-143, which are passed by modulating elements 125-41 and 125-43 to anamorphic optical system 130-1, are focused and centered on sub-imaging regions SL-41 to SL-43. Note that overlap of light passed by modulating elements 125-141 and 125-143 is ignored for explanatory purposes, and the slight offset in the Y-axis direction is amplified for illustrative purposes. The benefit of this tilted orientation is that imaging apparatus 200K produces a higher resolution linear image than that possible using a right-angle orientation, and allows for sub-pixel spacing addressability, and provides an opportunity to utilize software to position image "pixels" with fractional precision in both the X-axis and Y-axis directions.

Figure 16:
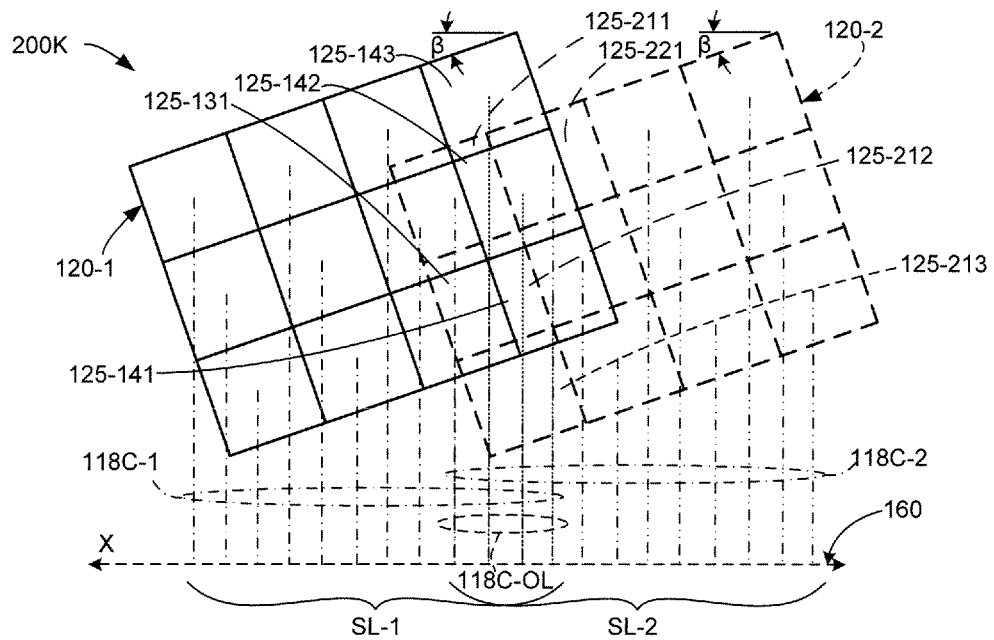
FIG. 16 is a perspective view showing another imaging apparatus portion including a tilted DMD-type spatial light modulator according to another specific embodiment of the present invention.
Figure 17:
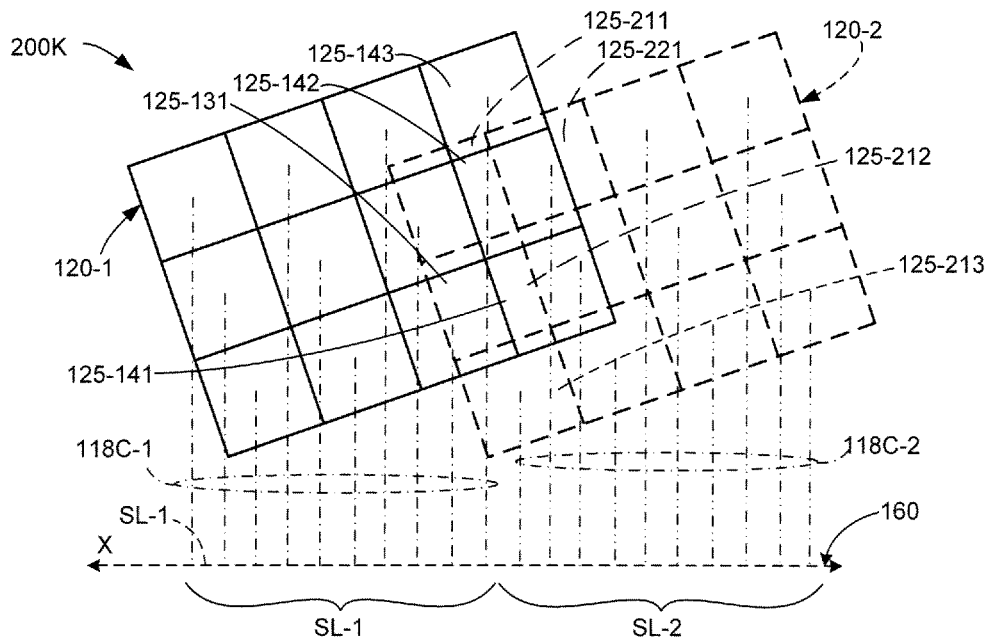
FIG. 17 is a simplified diagram depicting two tilted spatial light modulators of an imaging apparatus according to another specific embodiment of the present invention.

FIGS. 16 and 17 are simplified diagrams depicting a further portion of apparatus 200K including spatial light modulators 120-1 and 120-2, both being inclined at tilt angle 13 relative to associated scan line portions SL-1 and SL-2. FIG. 16 is modified to illustrate the effective pre-stitching overlap between light portions modulated by each of the various modulating elements (i.e., this overlap may be produced by the anamorphic projection optical systems, not shown, and not the physical overlap of spatial light modulators 120-1 and 120-2). In particular, light passing through spatial light modulator 120-1 forms imaged and concentrated light beams 118C-1 (indicated by dash-dot lines) that are directed onto scan structure 160 in the manner described above to produce scan line portion SL-1, and light passing through spatial light modulator 120-2 forms imaged and concentrated light beams 118C-2 (indicated by dash-dot-dot lines) that are directed onto scan structure 160 to produce scan line portion SL-2. Due to the overlap arrangement, certain elements produce overlapping concentrated light 118C-OL that generates redundant light spots on scan structure 160. For example, element 125-131 of spatial light modulator 120-1 is functionally aligned (overlapped) with element 125-211 of spatial light modulator 120-2, element 125-143 of spatial light modulator 120-1 is functionally aligned with element 125-211 of spatial light modulator 120-2, element 125-142 of spatial light modulator 120-1 is functionally aligned with element 125-213 of spatial light modulator 120-2, and element 125-141 of spatial light modulator 120-1 is functionally aligned with element 125-221 of spatial light modulator 120-2. A stitching control approach similar to that discussed above can be implemented to address the overlap situation shown in FIG. 16 by turning off (disabling) elements in the overlapping sections, and redistributing the image data to match the overall phase. For example, as shown in FIG. 17, the image data is modified such that modulating elements 125-141 and 125-142 of spatial light modulator 120-1 are effectively disabled, and the image data associated with the corresponding location on scan structure 160 is directed to modulating elements 125-221 and 125-213 of spatial light modulator 120-2. In addition, the image data is modified such that modulating elements 125-211 and 125-212 of spatial light modulator 120-2 are effectively disabled, and the image data associated with the corresponding location on scan structure 160 is directed to modulating elements 125-141 and 125-142 of spatial light modulator 120-1. The resulting stitched operation of apparatus 200K eliminates the overlap such that all concentrated light portions 118C-1 and 118C-2 are directed onto unique regions of scan structure 160.

Figure 18:
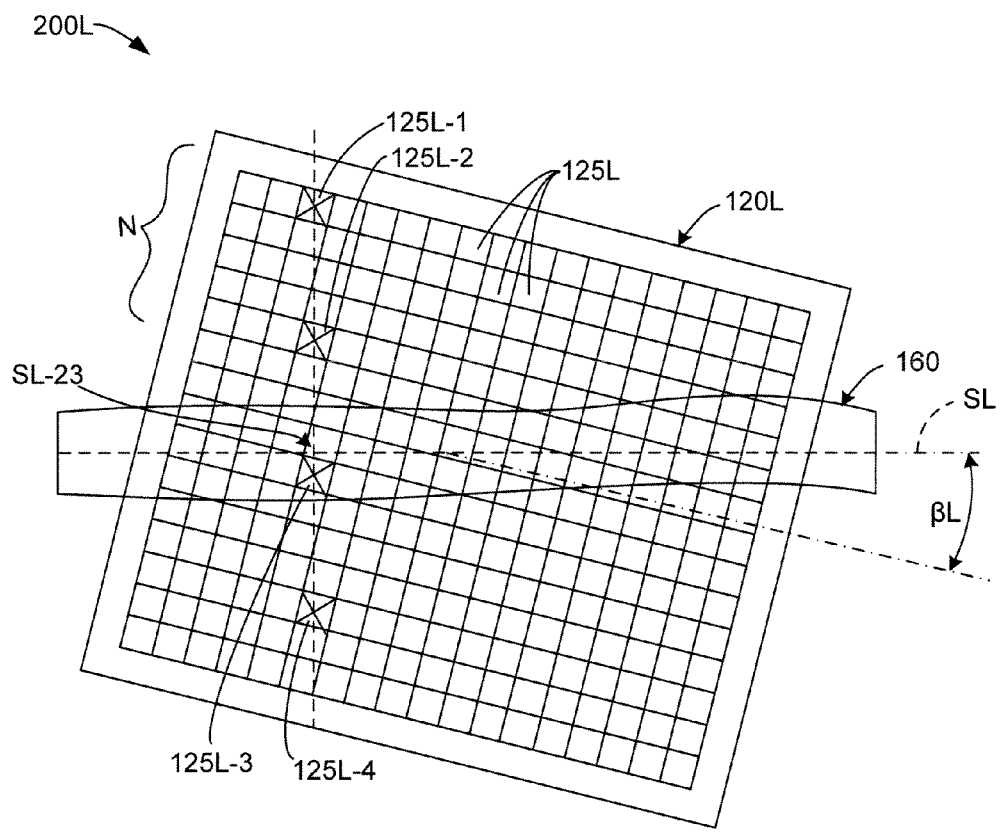
FIG. 18 is a simplified diagram depicting the two tilted spatial light modulators of FIG. 17 after image data is modified according to an embodiment of the present invention.

FIG. 18 is a partial front view showing a portion of an imaging apparatus 200L including a simplified DMD-type spatial light modulator 120L-1 that is inclined at a tilt angle βL relative to scan line SL-1 generated by an associated anamorphic optical system 130L-1 according to another specific embodiment of the present invention. Because exemplary DMD-type spatial light modulator 120L-1 includes fifteen mirrors 125L in each column, the range of possible tilt angles maybe selected from the range of 26.57° (i.e., the arctangent of ½) to 3.81° (i.e., the arctangent of ¹⁄₁₅). In the illustrated embodiment, tilt angle βL is approximately 14.0° (i.e., the arctangent of ¼) in order to produce a sub-pixel spacing of four pixels per column of mirrors. By adjusting the tilt angle βL between these two extremes, multiple mirrors 125L can be aligned with each imaging sub-region. For example, as indicated in FIG. 18, this sub-pixel spacing aligns four mirror elements 125L-1 to 125L-4 with an image sub-region SL-23 on scan line portion SL-1. Note that mirror elements 125L-1 to 125L-4 are disposed in different columns of DMD-type spatial light modulator 120L-1, and are aligned with image sub-region SL-23 only because of tilt angle βL. Note also that adjacent image pixels are slightly overlapped and provide extra addressability in the fast scan direction so that vertical edges can be adjusted left or right in sub-pixel increments. For the process direction, timing can be adjusted to ensure that horizontal edges are delayed or advanced in time to occur at a position where they are needed, also in sub-pixel increments.

Variable resolution can be implemented by controlling the number of mirror centers located within each imaging region. Referring to FIG. 15 as an example where n=3, using three mirrors in a vertical row increases the image resolution by a factor of three. In contrast, if a tilt angle were selected such that every four mirrors as in FIG. 18, a slightly smaller tilt angle βL is used than that of the embodiment shown in FIG. 15, producing a higher resolution. When n=786 (as in typical DLP chips), it is easy to see that a wide range of alternate resolutions could be implemented with high precision.

Similar to the orthogonal arrangement described above, the tilted orientation shown in FIG. 18 also facilitates variable power along scan line image SL. That is, to produce an image having a maximum power or brightness at image sub-region SL-23, all of mirror elements 125L-1 to 125L-4 may be toggled to the "on" position, and to produce an image having a lower power at image sub-region SL-23, one or more of mirror elements 125L-1 to 125L-4 may be toggled to the "off" position. Moreover, not all the DMD mirrors need be utilized for full power performance. One or more "reserve" mirrors can be saved (i.e., deactivated) during normal operation, and utilized to replace a malfunctioning mirror or to increase power above the normal "full" power during special processing operations. Conversely, fewer mirrors can be used to decrease power in a particular image sub-region to correct intensity defects. By calibrating the number of mirrors available for ablation as a function of scan position, the power can be kept uniform over the scan surface, and calibrated at will when off line.

Bow, tilt and process direction velocity imperfections such as banding can be also be controlled by the rate at which image lines and pixels are modulated on the array. Speeding up or slowing down this process will create higher or lower line resolution, respectively, or be used to compensate for banding. Delaying or advancing segments of lines or pixels in sub-resolution increments can be used to compensate for bow or tilt over the scan line. Furthermore, this arrangement can also be used to move horizontal edges of text, lineart, or dots for further process direction control of the image to complete a general two-dimensional hyperacuity printer capable of warping and registering images.

Figure 19:
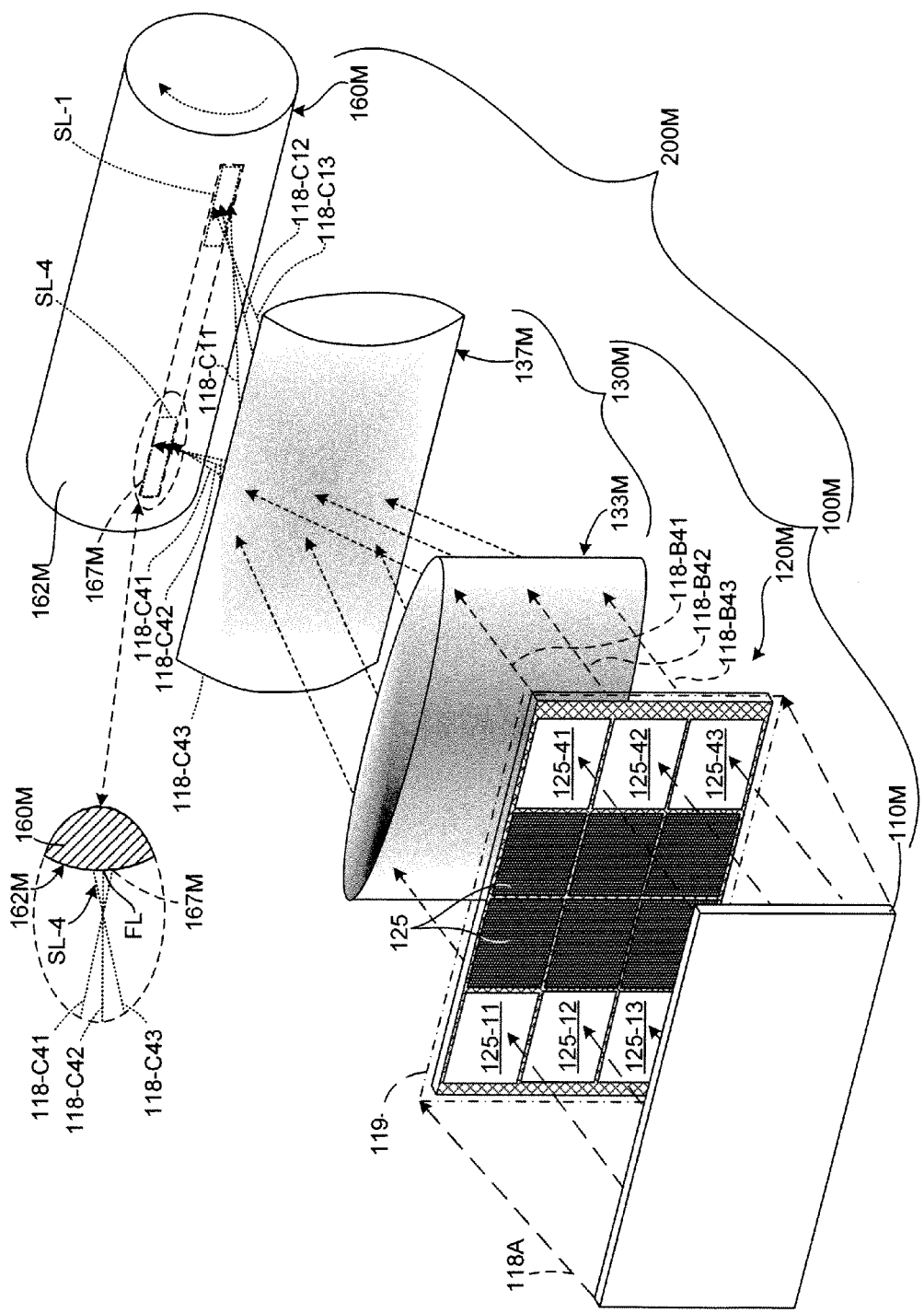
FIG. 19 is a perspective view showing an imaging apparatus according to another specific embodiment of the present invention.

FIG. 19 is a simplified perspective view showing a scanning/printing apparatus 200M that includes single-pass imaging system 100M and a scan structure (e.g., an imaging drum cylinder) 160M according to another embodiment of the present invention. As described above, imaging system 100M generally includes a homogenous light generator 110M, a spatial light modulator 120M, and an anamorphic optical (e.g., projection lens) system 130M that function essentially as set forth above. Referring to upper right portion of FIG. 19, imaging drum cylinder (roller) 160M is positioned relative to image system 100M such that anamorphic optical system 130M images and concentrates the modulated light portions received from spatial light modulator 120M onto an imaging surface 162M of imaging drum cylinder 160M, and in particular into an imaging region 167M of imaging surface 162M, using a cross-process optical subsystem 133M and a process-direction optical subsystem 137M in accordance with the technique described above with reference to FIGS. 4(A) and 4(B). In a presently preferred embodiment, cross-process optical subsystem 133M acts to horizontally invert the light passed through spatial light modulator 120M (i.e., such that light portions 118B-41, 118B-42 and 118B-43 are directed from the right side of cross-process optical subsystem 133M toward the left side of imaging region 167M). In addition, in alternative embodiments, imaging drum cylinder 160M is either positioned such that imaging surface 162M coincides with the scan (or focal) line defined by anamorphic optical system 130M, whereby the concentrated light portions (e.g., concentrated light portions 118C-41, 118C-42 and 118C-43) concentrate to form a single one-dimensional spot (light pixel) SL-4 in an associated portion of imaging region 167M, or such that imaging surface 162M is coincident with the focal line defined by anamorphic optical system 130M, whereby the light portions form a swath containing a few imaging lines (i.e., such that the light sub-pixel formed by light portion 118C-41 is separated from the light sub-pixel formed by light portion 118C-43. In a presently preferred embodiment, as indicated by the dashed-line bubble in the upper right portion of FIG. 15, which shows a side view of imaging drum cylinder 160M, imaging surface 162M is set at the focal line FL location such that the image generated at scan line SL-4 by beams 118C-41, 118C-42 and 118C-43 is inverted in the fashion indicated in the dashed-line bubble. Additional details regarding anamorphic optical system 130M are described in co-owned and co-pending application Ser. No. 13/216,976, entitled ANAMORPHIC PROJECTION OPTICAL SYSTEM for high speed lithographic data imaging, which is incorporated herein by reference in its entirety.

Figure 20A:
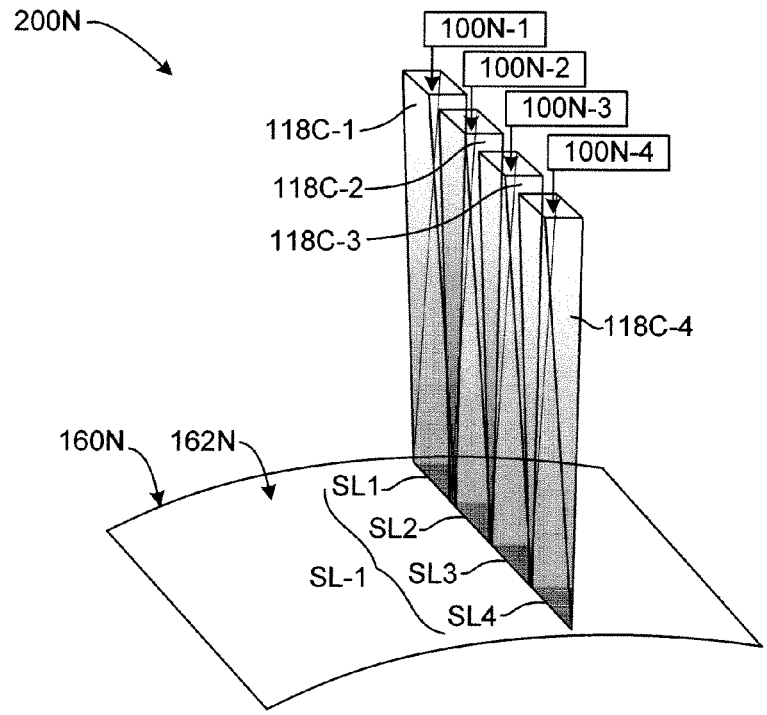
FIGS. 20(A) and 20(B) are simplified perspective diagrams showing alternative imaging apparatus according to alternative specific embodiments of the present invention.
Figure 20B:
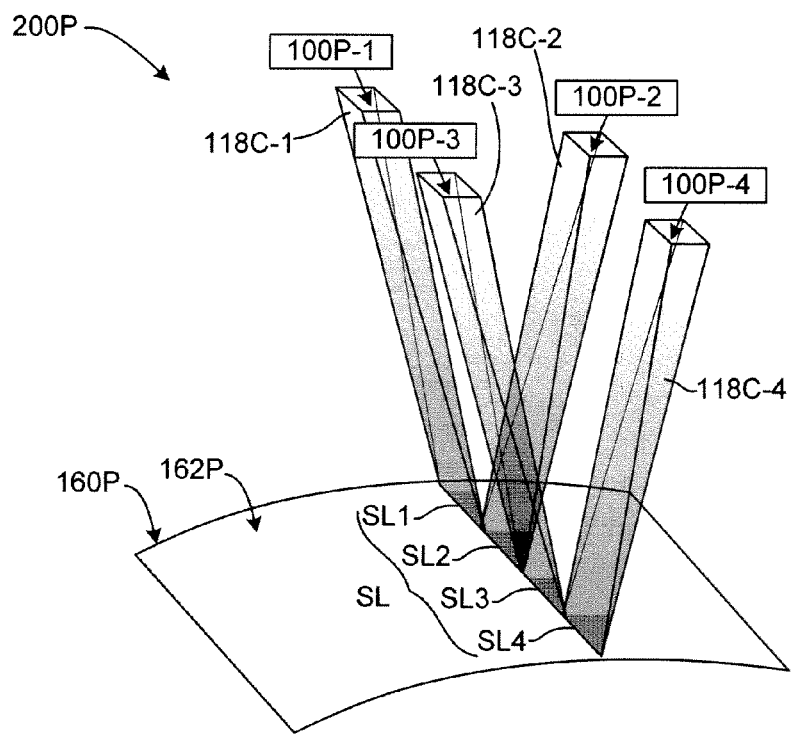

FIGS. 20(A) and 20(B) are simplified perspective views showing portions of imaging apparatus 200N and 200P according to alternative embodiments of the present invention. Each of these figures shows the wedge-shaped light beam fields 118C-1 to 118C-4 generated by associated imaging systems (which are shown as blocks to simplify the diagram and are understood to include a spatial light modulator and an associated anamorphic optical system), and a portion of an imaging drum cylinder on which the beam fields form associated scan line portions SL1-SL4, which collectively form a scan line SL in the manner described above. Imaging apparatus 200N and 200P are similar in that imaging systems 100N-1 to 100N-4 generate and direct wedge-shaped light beam fields 118C-1 to 118C-4 onto surface 162N of imaging drum cylinder 160N to form scan line SL (see FIG. 20(A)), and imaging systems 100P-1 to 100P-4 generate and direct wedge-shaped light beam fields 118C-1 to 118C-4 onto surface 162P of imaging drum cylinder 160P to form scan line SL (see FIG. 20(B)). Imaging apparatus 200N and 200P differ in that imaging systems 100N-1 to 100N-4 are arranged in an aligned pattern (e.g., using the techniques described above with reference to FIGS. 11-13), whereas imaging systems 100P-1 to 100P-4 are arranged in an offset pattern. That is, imaging systems 100P-1 to 100P-4 are arranged in two parallel rows, with imaging systems 100P-1 and 100P-3 aligned in the first row and imaging systems 100P-1 and 100P-3 aligned in the second row. Because all of imaging systems 100P-1 to 100P-4 are oriented to generate scan line SL, wedge-shaped light beam fields 118C-1 to 118C-4 are directed onto surface 162P from two different directions in an interlaced feathered manner and are separated by a shallow angle. This offset pattern arrangement provides more room between adjacent imaging systems 100P-1 to 100P-4 than that provided by the aligned arrangement of imaging apparatus 200N (FIG. 20(A)).

Although the present invention has been described with respect to certain specific embodiments, it will be clear to those skilled in the art that the inventive features of the present invention are applicable to other embodiments as well, all of which are intended to fall within the scope of the present invention. For example, although the present invention is illustrated as having light paths that are linear (see FIG. 1) or with having one fold (see FIG. 10), other arrangements may be contemplated by those skilled in the art that include folding along any number of arbitrary light paths.

The invention claimed is:

1. An apparatus for generating a scan line image in response to received image data, the apparatus comprising:
   at least one homogenous light source for generating homogenous light,
   a plurality of spatial light modulators, each spatial light modulator including:
      a plurality of light modulating elements arranged in a two-dimensional array and disposed such that a light modulating structure of each said modulating element receives an associated portion of the homogenous light, and
      means for individually controlling the plurality of modulating elements such that the light modulating structure of said each modulating element is adjustable, in response to an associated control signal, between a first modulated state and a second modulated state, wherein when the light modulating structure of said each modulating element is in said first modulated state, said each modulating element directs said associated received homogenous light portion in a corresponding predetermined direction, and when said light modulating structure of said each modulating element is in said second modulated state, said associated received light portion is prevented from passing along said corresponding predetermined direction by said each modulating element;
   a plurality of anamorphic optical systems, each said anamorphic optical system being positioned to receive modulated light portions from an associated spatial light modulator and configured to generate an associated anamorphically imaged and concentrated light field in response to said receive modulated light portions;
   a scan structure having an imaging surface and positioned relative to the plurality of anamorphic optical systems such that the anamorphically imaged and concentrated light field respectively form scan line portions in an elongated imaging region defined on the imaging surface; and
   an image stitching controller for modifying said received image data such that when said modified image data is transmitted to said plurality of spatial light modulators said plurality of light modulating elements of all of said plurality of spatial light modulators are cooperatively controlled such that the scan line portions collectively form said scan line image in the elongated imaging region,
   wherein the plurality of light modulating elements of each of the plurality of spatial light modulators are arranged in a plurality of rows and a plurality of columns, wherein each said column includes an associated group of said plurality of light modulating elements,
   wherein the plurality of anamorphic optical systems are arranged such that, when all of the spatial light elements of first and second spatial light modulators of said plurality of spatial light modulators are in the first modulated state, first and second scan line portions generated by said first and second anamorphic optical systems form an overlapping pattern in said elongated imaging region, and
   wherein the image stitching controller includes means for disabling one or more groups of said plurality of light modulating elements in one or more associated columns such that adjacent end portions of the first and second scan line portions are aligned in a scan direction to produce a seamlessly stitched portion of said single-pass scan line.

2. The apparatus according to claim 1,
   wherein each anamorphic optical system of the plurality of anamorphic optical systems is arranged such that light portions received from each associated group of said plurality of light modulating elements in each said column are directed by said each associated anamorphic optical system onto an associated scan line region of said generated scan line portion.

3. The apparatus according to claim 2, wherein the image stitching controller includes means for modifying a first data portion of said modified image data transmitted to said first spatial light modulator and for modifying a second data portion of said modified image data transmitted to said second spatial light modulator such that a feature of said scan line image extending across first and second scan line portions and generated in response to said first and second data portions is aligned in a cross-scan direction within said elongated imaging region.

4. The apparatus according to claim 1, wherein each of the plurality of anamorphic optical systems includes a cross-process optical subsystem including first and second focusing lenses arranged to project said received light portions onto the elongated imaging region in a cross-process direction.

5. The apparatus according to claim 4, wherein each of the plurality of anamorphic optical systems further comprises a process-direction optical subsystem including a third focusing lens arranged to focus said light portions received from the cross-process optical subsystem of each of the plurality of anamorphic optical systems onto the elongated imaging region in a process direction.

6. The apparatus according to claim 1, wherein each of the plurality of spatial light modulators comprise one of a digital micromirror device, an electro-optic diffractive modulator array, and an array of thermo-optic absorber elements.

7. The apparatus according to claim 1,
   wherein each of the plurality of light modulating elements of each of the plurality of spatial light modulators comprises a microelectromechanical (MEMs) mirror mechanism disposed on a substrate, and wherein each MEMs mirror mechanism includes a mirror and means for supporting and moving the mirror, in response to said modified image data, between a first tilted position relative to the substrate, and a second tilted position relative to the substrate.

8. The apparatus according to claim 7, wherein each spatial light modulator of said plurality of spatial light modulators and an associated anamorphic optical system of said anamorphic optical systems are cooperatively positioned such that, when the mirror of each said MEMs mirror mechanism of said each spatial light modulator is in the first tilted position, said mirror reflects said associated received light portion to the associated anamorphic optical system, and when said mirror of each said MEMs mirror mechanism is in the second tilted position, said mirror reflects said associated received light portion away from the associated anamorphic optical system.

9. The apparatus according to claim 8, further comprising at least one heat sink fixedly positioned relative to said each spatial light modulator such that when said mirror of each said MEMs mirror mechanism is in the second tilted position, said mirror reflects said associated received light portion onto said at least one heat sink.

10. The apparatus according to claim 9,
wherein said at least one homogenous light generator, said each spatial light modulator, said associated anamorphic optical system, and said at least one heat sink are mounted on a frame having a base portion defining a support area, a first arm and a second arm extending from the base portion on opposite sides of the support area, first and second brackets integrally attached to the first arm, and a third bracket integrally attached to the second arm,
wherein said each spatial light modulator is fixedly attached to the support area,
wherein the at least one homogenous light generator and the associated anamorphic optical system are respectively fixedly attached to the first and second brackets, and
wherein the at least one heat sink is fixedly attached to the third bracket.

11. The apparatus according to claim 10, further comprising a plurality of frames, each of the plurality of frames having a base portion defining a support area, a first arm and a second arm extending from the base portion on opposite sides of the support area, first and second brackets integrally attached to the first arm, and a third bracket integrally attached to the second arm,
wherein said each spatial light modulator is fixedly attached to the support area of an associated frame of said plurality of frames,
wherein the associated anamorphic optical system is fixedly attached to the second brackets of said associated frame, and
wherein the at least one heat sink is fixedly attached to the third bracket of said associated frame, and
wherein the plurality of frame are assembled such that said plurality of anamorphic optical systems are disposed in a side-by-side arrangement.

12. The apparatus according to claim 11,
wherein said at least one homogenous light generator comprises a plurality of homogenous light generators, and
wherein an associated homogenous light generator of said plurality of homogenous light generators is fixedly attached to the first bracket of each of the plurality of frames.

13. The apparatus according to claim 1,
wherein each of the plurality of spatial light modulators is tilted relative to the elongated imaging region such that an associated anamorphic optical system directs each light portions received from each of said plurality of light modulating elements onto an associated sub-imaging region of said scan line portion, whereby each said associated sub-imaging region is offset from an adjacent said associated sub-imaging region in both a scan direction and a cross-scan direction.

14. The apparatus according to claim 13,
wherein each of the plurality of light modulating elements comprises a microelectromechanical (MEMs) mirror mechanism disposed on a substrate, and
wherein each MEMs mirror mechanism including a mirror and means for supporting and moving the mirror between a first tilted position relative to the substrate, and a second tilted position relative to the substrate, according to said associated control signals generated by the controller.

15. The apparatus according claim 1, wherein the plurality of spatial light modulators and the plurality of anamorphic optical systems are arranged in one of an aligned pattern and an offset pattern.

16. An apparatus comprising:
at least one homogenous light source for generating homogenous light,
first and second spatial light modulators, each of the first and second spatial light modulators including:
a plurality of light modulating elements arranged in a plurality of rows and a plurality of columns and disposed such that each said modulating element receives an associated portion of the homogenous light, wherein each said column includes an associated group of said plurality of light modulating elements, and
a controller for individually controlling the plurality of modulating elements such that each modulating element is adjustable, in response to an associated control signal generated by the controller, between a first modulated state and a second modulated state, whereby when said each modulating element is in said first modulated state, said each modulating element directs said associated received light portion in a corresponding predetermined direction, and when said each modulating element is in said second modulated state, said associated received light portion is prevented from passing along said corresponding predetermined direction by said each modulating element;
first and second anamorphic optical systems, said first anamorphic optical system being positioned to receive first modulated light portions from said first spatial light modulator and configured to generate a first anamorphically imaged and concentrated light field, said second anamorphic optical system being positioned to receive second modulated light portions from said second spatial light modulator and configured to generate a second anamorphically imaged and concentrated light field;
a scan structure having an imaging surface and positioned relative to the first and second anamorphic optical systems such that the first anamorphically imaged and concentrated light field and the second anamorphically imaged and concentrated light field respectively form first and second scan line portions in an elongated imaging region defined on the imaging surface; and an image stitching controller for controlling the first and second spatial light modulators, wherein the first and second anamorphic optical systems are arranged such that, when all of the spatial light elements of the first and second spatial light modulators are in the first modulated state, first and second scan line portions generated by said first and second anamorphic optical systems form an overlapping pattern in said elongated imaging region, and wherein the image stitching controller includes means for disabling one or more groups of said plurality of light modulating elements in one or more associated columns such that adjacent end portions of the first and second scan line portions are aligned in a scan direction to produce a seamlessly stitched portion of said single-pass scan line.

17. An apparatus comprising:

a homogenous light generator for generating homogenous light such that the homogenous light forms a substantially uniform two-dimensional homogenous light field;

first and second spatial light modulators, each of the first and second spatial light modulators including:
- a plurality of light modulating elements arranged in a two-dimensional array and disposed in the homogenous light field such that each said modulating element receives an associated homogenous light portion of the homogenous light, and
- a controller for individually controlling the plurality of modulating elements such that each modulating element is adjustable, in response to an associated control signal generated by the controller, between a first modulated state and a second modulated state, whereby when said each modulating element is in said first modulated state, said each modulating element modulates an associated received homogenous light portion such that an associated modulated light portion is directed in a corresponding predetermined direction, and when said each modulating element is in said second modulated state, said each modulating element modulates the associated received homogenous light portion such that the associated modulated light portion is prevented from passing along said corresponding predetermined direction; and first and second anamorphic optical systems, said first anamorphic optical system being positioned to receive first modulated light portions from each modulating element of said first spatial light modulator disposed in said first modulated state and configured to generate a first anamorphically concentrated light field, said second anamorphic optical system being positioned to receive second modulated light portions from each modulating element of said second spatial light modulator disposed in said first modulated state and configured to generate a second anamorphically imaged and concentrated light field;

a scan structure having an imaging surface and positioned relative to the first and second anamorphic optical systems such that the first anamorphically imaged and concentrated light field and the second anamorphically imaged and concentrated light field respectively form first and second scan line portions in an elongated imaging region defined on the imaging surface; and means for controlling the first and second spatial light modulators such that the first and second scan line portions form a seamlessly stitched scan line image in the elongated imaging region.

* * * * *